US012666716B2

(12) United States Patent
Hu et al.

(10) Patent No.: US 12,666,716 B2
(45) Date of Patent: Jun. 23, 2026

(54) CMOS STRUCTURE, AND FABRICATION METHODS OF FINFET CMOS, FD CMOS AND GAA CMOS

(71) Applicant: Xidian University, Xi'an (CN)

(72) Inventors: Huiyong Hu, Xi'an (CN); Liming Wang, Xi'an (CN); Bin Shu, Xi'an (CN); Bin Wang, Xi'an (CN); Ningning Zhang, Xi'an (CN); Tian Miao, Xi'an (CN); Jian Zhang, Xi'an (CN); Lingyao Meng, Xi'an (CN); Maolong Yang, Xi'an (CN); Xinlong Shi, Xi'an (CN); Heming Zhang, Xi'an (CN)

(73) Assignee: Xidian University, Xi'an (CN)

( * ) Notice: Subject to any disclaimer, the term of this patent is extended or adjusted under 35 U.S.C. 154(b) by 489 days.

(21) Appl. No.: 18/122,783

(22) Filed: Mar. 17, 2023

(65) Prior Publication Data

US 2023/0223408 A1 Jul. 13, 2023

Related U.S. Application Data

(63) Continuation of application No. PCT/CN2020/138548, filed on Dec. 23, 2020.

(30) Foreign Application Priority Data

Sep. 18, 2020 (CN) .......................... 202010988350.9
Dec. 10, 2020 (CN) .......................... 202011435233.6
Dec. 23, 2020 (CN) .......................... 202011537255.3

(51) Int. Cl.
 *H10D 86/00* (2025.01)
 *H10D 86/01* (2025.01)

(52) U.S. Cl.
 CPC ......... *H10D 86/215* (2025.01); *H10D 86/011* (2025.01)

(58) Field of Classification Search
 CPC ............. H10D 84/853; H10D 84/0193; H10D 86/011; H10D 86/215
 See application file for complete search history.

(56) References Cited

U.S. PATENT DOCUMENTS

2009/0321832 A1* 12/2009 Ohmi ................... H10D 62/405
 257/350
2011/0068407 A1* 3/2011 Yeh ...................... H10D 84/038
 257/369
2019/0123165 A1* 4/2019 Akiyama ............. H10D 84/853

* cited by examiner

*Primary Examiner* — Reema Patel
(74) *Attorney, Agent, or Firm* — Hemisphere Law, PLLC

(57) ABSTRACT

Provided are a CMOS structure, and fabrication methods of a FinFET CMOS, an FD CMOS and a GAA CMOS. The CMOS structure includes an nMOS and a pMOS, The nMOS includes a first channel region and a first gate electrode formed on a semiconductor substrate, and the pMOS includes a second channel region and a second gate electrode formed on the semiconductor substrate, where the first channel region and the second channel region are formed of semiconductor materials with the same conductivity type, and the first gate electrode and the second gate electrode are formed of the conductive materials with the same work function. This CMOS structure reduces the processing steps for fabricating the CMOS, thereby reducing the process complexity and the production cost, which is beneficial for improving the performance and reliability of CMOS and its integrated circuits.

10 Claims, 21 Drawing Sheets

CMOS STRUCTURE, AND FABRICATION METHODS OF FINFET CMOS, FD CMOS AND GAA CMOS

TECHNICAL FIELD

The present disclosure relates to the semiconductor technical field, and in particularly to a complementary metal oxide semiconductor (CMOS) structure, and fabrication methods of a fin field-effect transistor (FinFET) CMOS, a fully depleted (FD) CMOS and a gate-all-around (GAA) CMOS.

DESCRIPTION OF RELATED ART

With the more and more extensive application of integrated circuits and the increasingly requirements of functions (especially for the integrated circuits performance), as a basic unit of the integrated circuits, CMOS structure requires to be continuously improved, and the performance and process level thereof are required to be continuously enhanced. Accordingly, researchers in this field had proposed numerous novel CMOS structures, but a basic CMOS structure is still composed of an nMOS and a pMOS.

With the continuous expansion of the scale of the integrated circuit and the continuous reduction of a feature size thereof, the CMOS structure has experienced a development history from a conventional planar CMOS, a FinFET CMOS, an FD-Silicon-On-Insulator (SOI) CMOS to the GAA CMOS.

For any of the CMOS structures described above, channel regions of the nMOS and the pMOS thereof are required to be made of semiconductor materials with different conductivity types, and similarly, gate electrodes of the nMOS and the pMOS are required to be made of the conductive materials with different work functions.

In order to realize the above two basic characteristics, complex process methods and steps are required, which will undoubtedly affect the process flow, process cost, and the performance of the device and a corresponding circuit.

SUMMARY

In order to solve the above problems in the related technology, the present disclosure provides a CMOS structure and fabrication methods of a FinFET CMOS, an FD CMOS and a GAA CMOS. The technical problems to be solved by the present disclosure are achieved by the following technical solutions.

A CMOS structure is provided, including an nMOS and a pMOS, where the nMOS includes a first channel region and a first gate electrode formed on a semiconductor substrate, and the pMOS includes a second channel region and a second gate electrode formed on the semiconductor substrate;

where the first channel region and the second channel region are formed of semiconductor materials with the same conductivity type; and where the first gate electrode and the second gate electrode are formed of conductive materials with the same work function.

In an embodiment of the present disclosure, the CMOS structure is a FinFET CMOS; where the first channel region is formed in a first fin, the second channel region is formed in a second fin, and the first fin and the second fin are formed of the semiconductor materials with the same conductivity type; and where the first gate electrode is located on the first fin, and the second gate electrode is located on the second fin.

In an embodiment of the present disclosure, the CMOS structure is a FD CMOS;

where the first channel region and the second channel region are formed in a top semiconductor layer of the semiconductor substrate, the semiconductor substrate includes an insulating layer and the top semiconductor layer, and the top semiconductor layer is located on the insulating layer; and where the first gate electrode is located on the first channel region, and the second gate electrode is located on the second channel region.

In an embodiment of the present disclosure, the CMOS structure is a GAA CMOS;

where the first channel region is formed in a first nano-body structure, the second channel region is formed in a second nano-body structure, and the first nano-body structure and the second nano-body structure are formed of the semiconductor materials with the same conductivity type; and where the first nano-body structure is surrounded by the first gate electrode, and the second nano-body structure is surrounded by the second gate electrode.

In an embodiment of the present disclosure, the first channel region and the second channel region are formed by n-type semiconductor materials with the same doping concentration; a first source region and a first drain region of the nMOS are n-type doped; and a second source region and a second drain region of the pMOS are p-type doped.

In an embodiment of the present disclosure, the work function of the first gate electrode and the second gate electrode is in a range from 4.6 electron-volts (eV) to 5.1 eV.

In an embodiment of the present disclosure, the first channel region and the second channel region are formed by p-type semiconductor materials with the same doping concentration; a first source region and a first drain region of the nMOS are n-type doped; and a second source region and a second drain region of the pMOS are p-type doped.

In an embodiment of the present disclosure, the work function of the first gate electrode and the second gate electrode is in a range from 4.1 eV to 4.5 eV.

An embodiment of the present disclosure further provides a fabrication method of the CMOS structure described above, where the COMS structure is a FinFET CMOS, and the fabrication method includes:

providing the semiconductor substrate;

forming a first fin and a second fin with the same conductivity type on the semiconductor substrate, where the first fin includes the first channel region, and the second fin includes the second channel region;

forming a gate dielectric layer on top and sidewall surfaces of the first fin and the second fin, and the first gate electrode and the second gate electrode with the same work function;

fabricating a first source region and a first drain region in the first fin to form the nMOS; and fabricating a second source region and a second drain region in the second fin to form the pMOS.

An embodiment of the present disclosure further provides a fabrication method of the CMOS structure described above, where the CMOS structure is an FD COMS and the fabrication method includes:

providing the semiconductor substrate, where the semiconductor substrate includes an insulating layer and a top semiconductor layer, the top semiconductor layer is located on the insulating layer, and the top semiconductor layer is p-type doped or n-type doped, and the top semiconductor layer includes the first channel region and the second channel region;

forming a gate dielectric layer, and the first gate electrode and the second gate electrode with the same work function, on the top semiconductor layer;

fabricating a first source region and a first drain region in the top semiconductor layer to form the nMOS; and fabricating a second source region and a second drain region in the top semiconductor layer to form the pMOS.

An embodiment of the present disclosure further provides a fabrication method of the CMOS structure described above, where the CMOS structure is a GAA CMOS, and the fabrication method includes:

providing the semiconductor substrate;

forming a first material stacked layer and a second material stacked layer on the semiconductor substrate;

etching the first material stacked layer and the second material stacked layer to form a first nano-body structure and a second nano-body structure, where the first nano-body structure and the second nano-body structure have the same conductivity type, the first nano-body structure includes the first channel region, and the second nano-body structure includes the second channel region;

forming a gate dielectric layer around the first nano-body structure and the second nano-body structure, and the first gate electrode and the second gate electrode with the same work function;

fabricating a first source region and a first drain region in the first nano-body structure to form the nMOS; and fabricating a second source region and a second drain region in the second nano-body structure to form the pMOS.

The present disclosure has at least the following beneficial effects.

In the present disclosure, both the nMOS and the pMOS are fabricated with semiconductor materials with the same conductivity type (preferably the same doping concentration), so it is not necessary to fabricated an n-type region or a p-type region respectively. Furthermore, because gate electrodes of the nMOS and the pMOS are formed of the conductive materials with the same work function (preferably the same conductive material), it is not necessary to fabricate the gate electrode of the nMOS and the gate electrode of the pMOS respectively, as such the present disclosure reduces the processing steps for fabricating the CMOS structure, simplifies the process flow, thereby reducing the fabrication cost and process difficulty, and further improving the electrical characteristics and reliability of the CMOS and its integrated circuit.

The present disclosure will be further described in detail combined with accompanying drawings and embodiments.

DETAILED DESCRIPTION OF EMBODIMENTS

Figure 1:
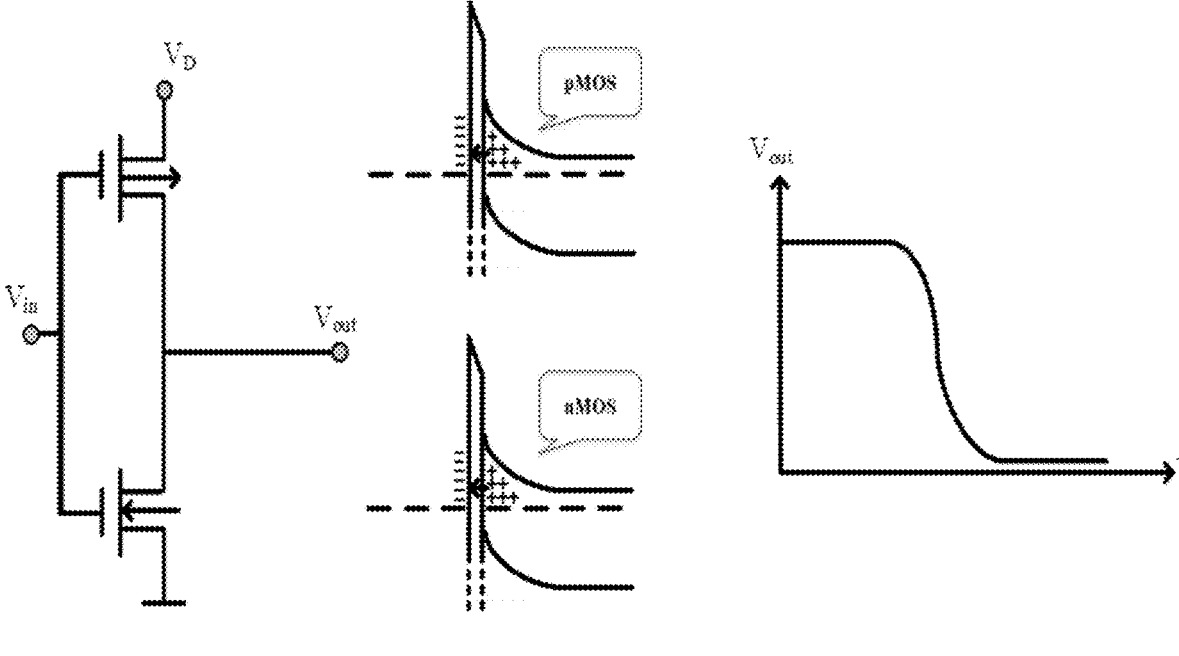
FIG. 1 illustrates a schematic diagram of a CMOS structure according to an embodiment of the present disclosure.

The present disclosure will be further described in detail combined with specific embodiments, but embodiments of the present disclosure are not limited to the specific embodiments.

In order to have a better understanding for the technical solutions of the present disclosure, before a CMOS structure provided by an embodiment of the present disclosure is introduced, a FinFET CMOS, an FD-SOI CMOS, and a GAA CMOS are described.

The CMOS has a structure that a drain electrode of an nMOS and a drain electrode of a pMOS are connected together, and a gate electrode of the nMOS and a gate electrode of the pMOS are connected together. The nMOS and the pMOS are each composed of three regions called a source region, a drain region, and a gate region (also referred to as channel region), and there is an electrode in each of the source region, the drain region and the gate region, which are called a source electrode, a drain electrode and a gate electrode respectively. The channel region of the nMOS is formed of a p-type semiconductor material, and each of the source region and the drain region of the nMOS are formed of an n-type semiconductor material. The channel region of the pMOS is formed of an n-type semiconductor material, and the source region and the drain region of the pMOS are formed of a p-type semiconductor material. Furthermore, the gate electrodes of the nMOS and the pMOS are formed of the conductive materials with different work functions. Accordingly, the following two aspects should be concerned for the CMOS.

1. The channel regions of the nMOS and the pMOS are required to be made of the semiconductor materials with different conductivity types.
2. The gate electrodes of the nMOS and the pMOS are required to be made of the conductive materials with different work functions.

For the FinFET CMOS, a substrate thereof may be bulk Si or an SOI. Compared with the conventional CMOS, the only difference is that each of an nMOS and a pMOS of the FinFET CMOS has a three-dimensional bulk structure. The three-dimensional bulk structures of the nMOS and the pMOS are fin-shaped, so the FinFET CMOS is called a fin-shaped field effect transistor. Other features of the FinFET CMOS are the same as those of the conventional CMOS. The following two aspects also should be concerned for the FinFET CMOS.

1. For the FinFET CMOS, fins of the nMOS and the pMOS are required to be made of semiconductor materials of different conductivity types.
2. For the FinFET CMOS, gate electrodes of the nMOS and the pMOS are required to be made of the conductive materials with different work functions.

For the FD CMOS, a substrate thereof is the SOI. Compared with the conventional CMOS, the nMOS and the pMOS of the FD CMOS are fabricated on the top semiconductor thin layer material of the SOI, and channel regions of the nMOS and the pMOS of the FD CMOS are completely depleted without a bias voltage. However, similar to the conventional CMOS, the following two aspects also should be concerned for the FD CMOS.

1. For the FD CMOS, the channel regions of the nMOS and the pMOS are required to be made of semiconductor materials with different conductivity types.
2. For the FD CMOS, gate electrodes of the nMOS and the pMOS are required to be made of the conductive materials with different work functions.

For the GAA CMOS, a substrate thereof may be bulk Si or an SOI. The GAA is called gate-all-around (ring gate or fence), which means that a channel region of a MOS (including nMOS and pMOS) of the GAA CMOS is surrounded by a gate electrode. A material of the channel region of GAA CMOS can be a nanowire or a nanosheet, the former is called a GAA nanowire CMOS, and the latter is called a GAA nanosheet CMOS. The GAA nanowire/nanosheet CMOS may be a single layer distributed in a horizontal plane, or may be a three-dimensional multilayer. When the GAA nanowire/nanosheet CMOS is multilayer, it is called stacked GAA nanowire/nanosheet CMOS. At present, both the single-layer GAA nanowire/nanosheet CMOS and the stacked GAA nanowire/nanosheet CMOS are similar to the conventional CMOS, the following two aspects also should be concerned.

1. A GAA nanowire/nanosheet nMOS and a GAA nanowire/nanosheet pMOS are required to be made of semiconductor materials with different conductivity types.
2. Gate electrodes of the GAA nanowire/nanosheet nMOS and the GAA nanowire/nanosheet pMOS are required to be made of the conductive materials with different work functions.

Based on the above, it can be seen that for any of the conventional CMOS, the FinFET CMOS, the FD-SOI CMOS, and the GAA CMOS, there are two aspects to be concerned as mentioned above. Although they are only two aspects, it requires a complicated technological process and steps to realize the above two aspects, which will increase the difficulty and cost of the technological process and correspondingly affect the performance and reliability of the device itself and the corresponding circuit.

First Embodiment

Based on the above reasons, an embodiment of the present disclosure provides a CMOS structure, which includes an nMOS and a pMOS. Specifically, the nMOS includes a first channel region and a first gate electrode formed on a semiconductor substrate, and the pMOS includes a second channel region and a second gate electrode formed on the same semiconductor substrate. The first channel region and the second channel region are formed of semiconductor materials with the same conductivity type; and the first gate electrode and the second gate electrode are formed of conductive materials with the same work function.

In a specific embodiment, the semiconductor materials of the first channel region and the second channel region are n-type semiconductor materials with the same doping concentration, a first source region and a first drain region of the nMOS are n-type doped, and a second source region and a second drain region of the pMOS are p-type doped.

Further, if both the first channel region and the second channel region are formed of the same n-type semiconductor material with the same doping concentration, then the first gate electrode and the second gate electrode are formed of the same conductive material whose work function is close to a valence-band maximum of the n-type semiconductor material, and the work function of the selected first and second gate electrodes is able to completely deplete the n-type semiconductor material in the channel regions. In a preferable embodiment, work function of the first gate electrode and the second gate electrode is in a range from 4.6 electron-volts (eV) to 5.1 eV, and a specific value of the work function depends on parameters such as thickness and the doping concentration of the n-type semiconductor material, which is not limited herein.

In a specific embodiment, the semiconductor materials of the first channel region and the second channel region are p-type semiconductor materials with the same doping concentration, the first source region and the first drain region of the nMOS are n-type doped, and the second source region and the second drain region of the pMOS are p-type doped.

Further, if both the first channel region and the second channel region are formed of the same p-type semiconductor material with the same doping concentration, then the first gate electrode and the second gate electrode are formed of the same conductive material whose work function is close to the conduction band bottom of the p-type semiconductor material, and the work function of the selected first and second gate electrodes is able to completely deplete the p-type semiconductor material in the channel regions. In a preferable embodiment, the work function of the first gate electrode and the second gate electrode is in a range from 4.1 eV to 4.5 eV, and a specific value of the work function depends on parameters such as a thickness and the doping concentration of the p-type semiconductor material, which is not limited herein.

Referring to FIG. 1, FIG. 1 illustrates the schematic diagram of a CMOS according to an embodiment of the present disclosure. From the CMOS structure provided in this embodiment and FIG. 1, it can be seen that when a positive voltage VD is applied to a power supply and an input terminal is not connected to any voltage, both an nMOS and a pMOS are in a turn-off state, and the CMOS does not work. When an input voltage of 0 volt (V) is input into the input terminal, the pMOS is turned on and an output terminal outputs a high level. After that, with the input voltage gradually rising from 0 V, the pMOS gradually transits to the turn-off state and the nMOS gradually transits to a turn-on state. When the pMOS is turned off and the nMOS is turned on, the output terminal outputs a low level.

In this embodiment, the channel regions of the nMOS and the pMOS are formed of semiconductor materials with the same conductivity type and having the same or similar doping concentration, preferably the same doping concentration, that is to say, each of the first channel region of the nMOS and the second channel region of the pMOS is fabricated with a p-type semiconductor with a certain doping concentration or fabricated with an n-type semiconductor with a certain doping concentration, so that it is not necessary to specially fabricate an n-type region (when fabricated with the p-type semiconductor with a certain doping concentration) or a p-type region (when fabricated with the n-type semiconductor with a certain doping concentration). Therefore, for the CMOS structure of this embodiment, a fabrication process of the n-type region or the p-type region can be omitted. Although only the fabrication process of the n-type region or the p-type region appears to be omitted, multiple processing steps can be reduced, which is extremely beneficial and useful to shorten the process cycle, control the process error, reduce the chip process cost, and improve the performance and reliability of the device itself and a corresponding circuit, and this problem is just one of core issues that the industry attaches importance to and has long been concerned about. Further, since the gate electrodes of the nMOS and the pMOS in this embodiment are respectively formed of the conductive materials with the same work function, preferably the same conductive material, when the same conductive material is used as the gate electrodes, it is not necessary to fabricate the gate electrodes of the nMOS and the pMOS separately. Accordingly, although it seems that only a key process of fabricating the gate electrodes is reduced, it can also reduce multiple processing steps, shorten the process cycle, control the process error, and reduce the chip process cost. In addition, gate regions of the CMOS are sensitive regions of the CMOS, the performance of the CMOS is controlled by the gate electrodes, and a process for fabricating the gate electrodes will affect the performance of the CMOS, therefore, the gate electrodes of the nMOS and the pMOS are formed of the same conductive material with the same work function, and the gate electrodes only need to be fabricated once, which is beneficial to improving the performance and reliability of the CMOS.

In summary, in this embodiment, two key technologies of the CMOS are simplified, the processing steps for fabricating the CMOS are reduced, and the process and difficulty thereof are reduced, so that the fabrication cost can be reduced, and the yield, performance and reliability of the CMOS and its integrated circuit can be improved. In addition, the CMOS provided by this embodiment can also increase a regulation dimension of the threshold voltage and improve the switching speed.

It should be noted that the CMOS of this embodiment may be any one of a FinFET CMOS, an FD CMOS, and a GAA CMOS, or may be other CMOS with similar characteristics.

Second Embodiment

Figure 2:
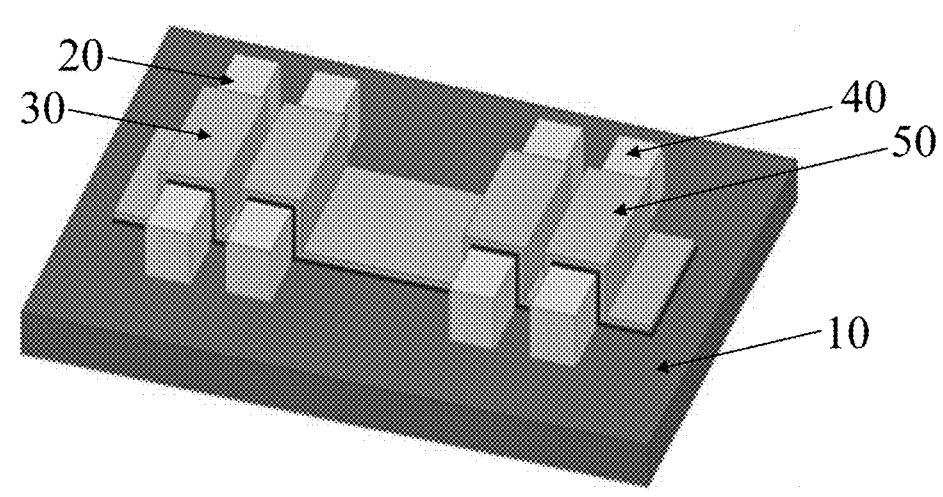
FIG. 2 illustrates a schematic structural view of a FinFET CMOS according to an embodiment of the present disclosure.

Referring to FIG. 2, FIG. 2 illustrates the schematic structural view of a FinFET CMOS according to an embodiment of the present disclosure. Based on the first embodiment, this embodiment provides the FinFET CMOS, which includes an nMOS and a pMOS. The nMOS includes at least one first fin 20 and a first gate electrode 30 formed on a semiconductor substrate 10, and the pMOS includes at least one second fin 40 and a second gate electrode 50 formed on the semiconductor substrate 10. The at least one first fin 20 and the at least one second fin 40 are formed of semiconductor materials with the same conductivity type, that is to say, a first channel region of the nMOS and the second channel region of the pMOS are respectively formed of the at least one first fin 20 and the at least one second fin 40 with the same conductivity type. The first gate electrode 30 and the second gate electrode 50 are located on the at least one first fin 20 and the at least one second fin 40, respectively. It should be emphasized that thicknesses and doping concentrations of the first fin 20 and the second fin 40 should meet the requirement of complete depletion under the work functions of the gate electrodes. The work functions of the first gate electrode 30 and the second gate electrode 50 are able to make the channel regions of the fins completely deplete.

Specifically, when materials of the at least one first fin 20 and the second fin 40 are n-type semiconductor materials with the same doping concentration, it is preferable that the work functions of the first gate electrode 30 and the second gate electrode 50 is in a range from 4.6 eV to 5.1 eV. When the materials of the first fin 20 and the at least one second fin 40 are p-type semiconductor materials with the same doping concentration, it is preferable that the work functions of the first gate electrode 30 and the second gate electrode 50 is in a range from 4.1 eV to 4.5 eV. A specific value of the work function of the gate electrodes depends on parameters such as thickness and doping concentration of a corresponding fin, which is not limited herein.

In this embodiment, the semiconductor substrate 10 may be bulk silicon or an SOI, so the first fin 20 and the second fin 40 can be formed by directly etching a surface silicon material of the bulk silicon or the SOI. In addition, the materials of the first fin 20 and the second fin 40 can be Germanium (Ge), Silicon Germanium (SiGe), III-V, or Silicon Carbide (SiC), for example, these materials may be formed by epitaxial growth on the surface silicon material, and the first fin 20 and the second fin 40 may be formed by etching these materials.

In this embodiment, the fins of the nMOS and the pMOS are formed of semiconductor materials with the same conductivity type, and having the same or similar doping concentration, preferably the same doping concentration, as such, multiple processing steps may be reduced, which is extremely beneficial and useful to shorten the process cycle, control the process error, reduce the chip process cost, and improve the performance and reliability of the device itself and a corresponding circuit. Further, since the gate electrodes of the nMOS and the pMOS in this embodiment are formed of conductive materials with the same work function, preferably the same conductive material, multiple processing steps can be reduced, the process cycle is shortened, the process error is controlled, and the chip process cost is reduced. In addition, the gate electrodes of the nMOS and the pMOS are formed of the same conductive material with the same work function, and the gate electrodes only need to be fabricated once, which is beneficial to improving the performance and reliability of the FinFET CMOS.

In summary, this embodiment simplifies two key process technologies of FinFET CMOS, reduces the processing steps for fabricating FinFET CMOS, and reduces the process and process difficulty, thus reducing the fabrication cost, and further improving the yield, performance and reliability of the FinFET CMOS and its integrated circuit. In addition, the FinFET CMOS provided by this embodiment can also increase the regulation dimension of the threshold voltage and improve the switching speed.

Third Embodiment

Based on the second embodiment, this embodiment also provides the fabrication method of the FinFET CMOS, which includes following steps 3.1 to 3.5.

In step 3.1, a semiconductor substrate 10 is provided.

In step 3.2, a first fin 20 and a second fin 40 with the same conductivity type are formed on the semiconductor substrate 10.

In step 3.3, a gate dielectric layer is formed on the top surfaces and sidewall surfaces of the first fin 20 and the second fin 40, and the first gate electrode 30 and the second gate electrode 50 with the same work function are formed.

In step 3.4, a first source region and a first drain region in the first fin 20 are fabricated to form an nMOS.

step 3.5, a second source region and a second drain region in the second fin 20 are fabricated to form a pMOS.

Further, in a specific embodiment, the step 3.2 may specifically include etching the semiconductor substrate 10 to form the first fin 20 and the second fin 40 with the same conductivity type on the semiconductor substrate 10.

Specifically, the first fin 20 and the second fin 40 may be formed on semiconductor materials with the same conductivity type and the same or similar doping concentration by directly etching the semiconductor substrate 10. For example, the semiconductor substrate 10 may be bulk silicon or an SOI.

Further, in another embodiment, the step 3.2 may further specifically include: forming a fin material layer on the semiconductor substrate 10, and etching the fin material layer to form the first fin 20 and the second fin 40 on the semiconductor substrate 10.

Specifically, forming the fin material layer for forming the first fin 20 and the second fin 40 on the semiconductor substrate 10, and then etching the fin material layer and forming the first fin 20 and the second fin 40 according to the structures of the first fin 20 and the second fin 40. For example, the fin material layer may be at least one selected from the group consisting of Si, Ge, SiGe, III-V group, and SiC.

Further, in a specific embodiment, the step 3.3 may specifically include: growing a dielectric material on the top surfaces and the sidewall surfaces of the first fin 20 and the second fin 40 to form the gate dielectric layer; and growing a gate electrode material on a surface of the gate dielectric layer to form the first gate electrode 30 and the second gate electrode 50 with the same work function.

Specifically, after the first fin 20 and the second fin 40 are formed, it is necessary to form the gate dielectric layer on the top surface and the sidewall surface of each of the first fin 20 and the second fin 40, and then form the conductive material layer for forming the first gate electrode 30 and the second gate electrode 50 on the gate dielectric layer. The first gate electrode 30 is correspondingly formed on the first fin 20, and the second gate electrode 50 is correspondingly formed on the second fin 40.

It should be noted that a sequence of steps of the fabrication method of this embodiment is not the only sequence to realize the FinFET CMOS provided in the second embodiment, but also for the convenience to explain the fabrication method of this embodiment. For example, the first source region, the first drain region, the second source region and the second drain region can be fabricated first, and then the gate dielectric layer, the first gate electrode and the second gate electrode can be fabricated, which is not limited by the order of steps in this embodiment.

It should be understood that other specific process means for fabricating the FinFET CMOS in this embodiment can be realized by the prior art, and will not be repeated in detail herein.

The process technology involved in the present disclosure is compatible with the existing CMOS process technology, so the whole process is not given in this embodiment, and the order of some processes can be changed.

Fourth Embodiment

Figure 3:
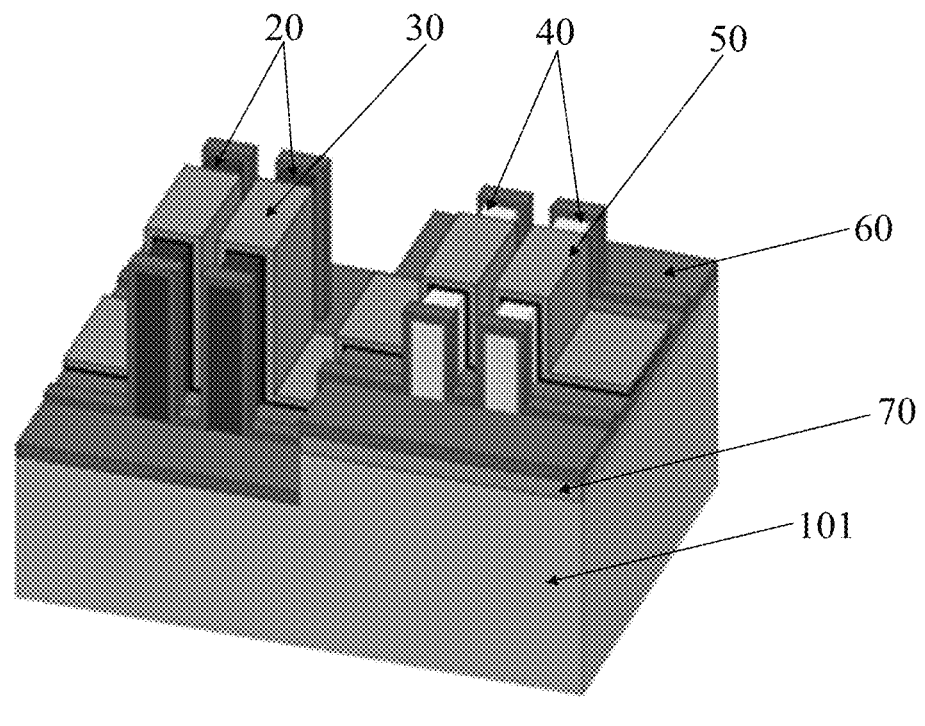
FIG. 3 illustrates a schematic structural view of a bulk-silicon-substrate-based FinFET CMOS according to an embodiment of the present disclosure.

Referring to FIG. 3, FIG. 3 illustrates the schematic structural view of a bulk-silicon-substrate-based FinFET CMOS according to an embodiment of the present disclosure. The present disclosure also provides a FinFET CMOS fabricated on a bulk silicon substrate on the basis of the second and third embodiments, that is to say, the semiconductor substrate 10 of this embodiment is bulk silicon, an nMOS of the FinFET CMOS includes at least one first fin 20 formed on the bulk silicon, and a pMOS of the FinFET CMOS includes at least one second fin 40 formed on the bulk silicon. The bulk silicon includes a Si substrate layer 101 and a Si epitaxial layer located on the Si substrate layer. The Si substrate layer 101 is a p-type material, and the Si epitaxial layer is an n-type material. The first fin 20 and the second fin 40 are formed of the Si epitaxial layer located on a surface layer of the bulk silicon, therefore, materials of the first fin 20 and the second fin 40 are n-type semiconductor materials with the same doping concentration. Further, a first insulating layer 60 is formed on other portion of the bulk silicon except the portion where the first fin 20 and the second fin 40 are formed, and a first gate electrode 30 is formed on the first fin 20 and a second gate electrode 50 is formed on the second fin 40. The first gate electrode 30 and the second gate electrode 50 are formed of the conductive materials with the same work function, a gate dielectric layer is formed between the gate electrodes and the fins, and fin portions of the fins which are in contact with the gate dielectric layer are channel regions. Two ends of the channel region are provided respectively with a source region and a drain region. The fin portion between the first source region and the first drain region of the nMOS is the first channel region, and the fin portion between the second source region and the second drain region of the pMOS is the second channel region.

In addition, for the FinFET CMOS with the fins made of n-type semiconductor materials, an n-type semiconductor layer 70 with the same doping concentration as the second fin 40 may be formed under the second fin 40 of the pMOS, which is beneficial to the design and performance of the FinFET CMOS.

Further, the second fin 40 of the pMOS and the first fin 20 of the nMOS may be selected as a crystal plane (100) or a crystal plane (110), or the second fin 40 of the pMOS and the first fin 20 of the nMOS may be selected the crystal plane (110) and the crystal plane (100), respectively.

Referring to FIGS. 4a to 4f, FIGS. 4a to 4f illustrate schematic views of the fabrication process of the bulk-silicon-substrate-based FinFET CMOS according to the embodiment of the present disclosure. Based on the above contents, this embodiment also provides a fabrication method for the FinFET CMOS on the bulk silicon, which includes the following steps 4.1 to 4.6.

In step 4.1, bulk silicon is provided.

Figure 4A:
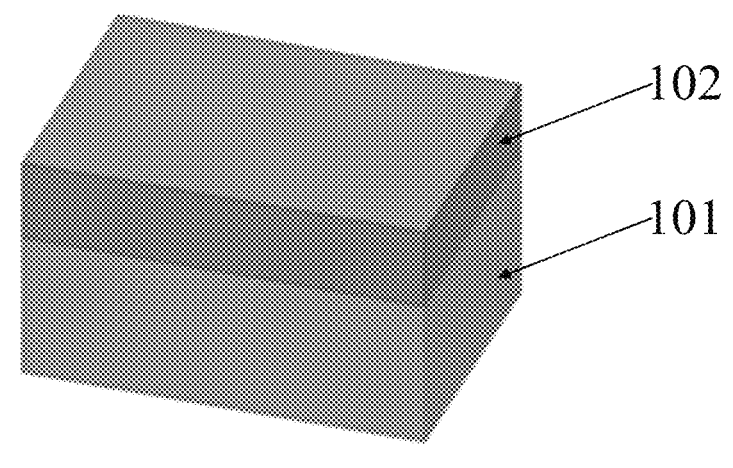
FIGS. 4a to 4f illustrate schematic views of a fabrication process of the bulk-silicon-substrate-based FinFET CMOS according to an embodiment of the present disclosure.

Referring to FIG. 4a, the bulk silicon includes a Si substrate layer 101 and a Si epitaxial layer 102 located on the Si substrate layer 101, where the Si substrate layer is formed of a p-type material and the Si epitaxial layer is formed of an n-type material.

Figure 4B:
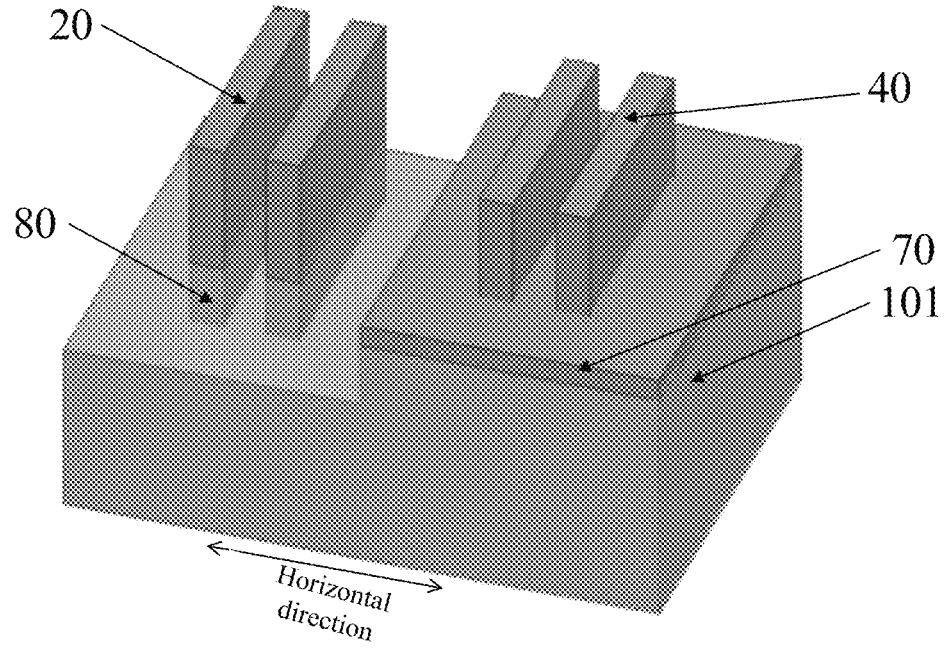

In step 4.2, referring to FIG. 4b, the Si epitaxial layer 102 of the bulk silicon is etched to form a first fin 20 and a second fin 40, and a portion of a certain thickness of the Si epitaxial layer 102 should be reserved under all the second fin 40 of the pMOS, and the reserved Si epitaxial layer 102 is used as the n-type semiconductor layer 70. When the first fin 20 is formed by etching, the bulk silicon can be etched to the Si substrate layer 101, therefore, a first transition structure 80 whose cross section having the same or similar shape and dimension as a preset cross section of each first fin 20 is reserved at a lower part of the first fin 20 of the nMOS. A material of the first transition structure 80 is a p-type semiconductor material. The preset cross section is a cross section in a horizontal direction as shown in FIG. 4b, and this design solution is beneficial to the design and performance of the FinFET CMOS.

Figure 4C:
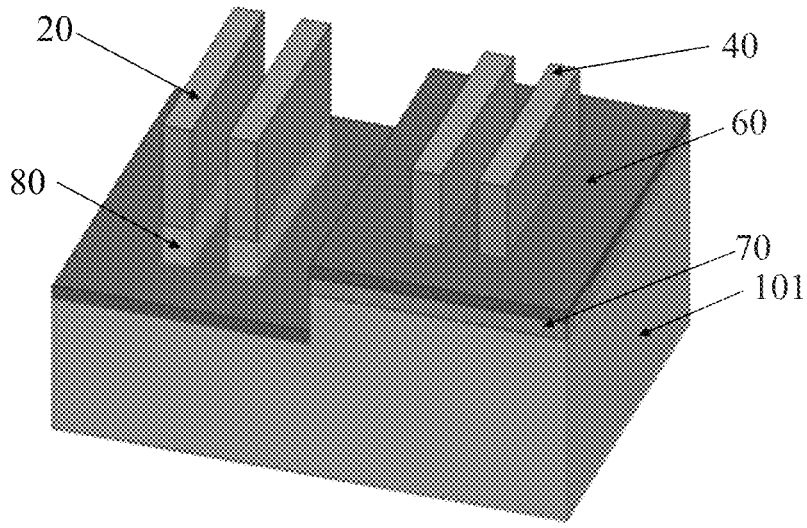

In step 4.3, referring to FIG. 4c, a first insulating layer 60 is formed on the other portion of the bulk silicon except the portion where the first fin 20 and the second fin 40 are formed. The first insulating layer 60 is formed of an insulating material such as $SiO_2$ or SiN.

Figure 4D:
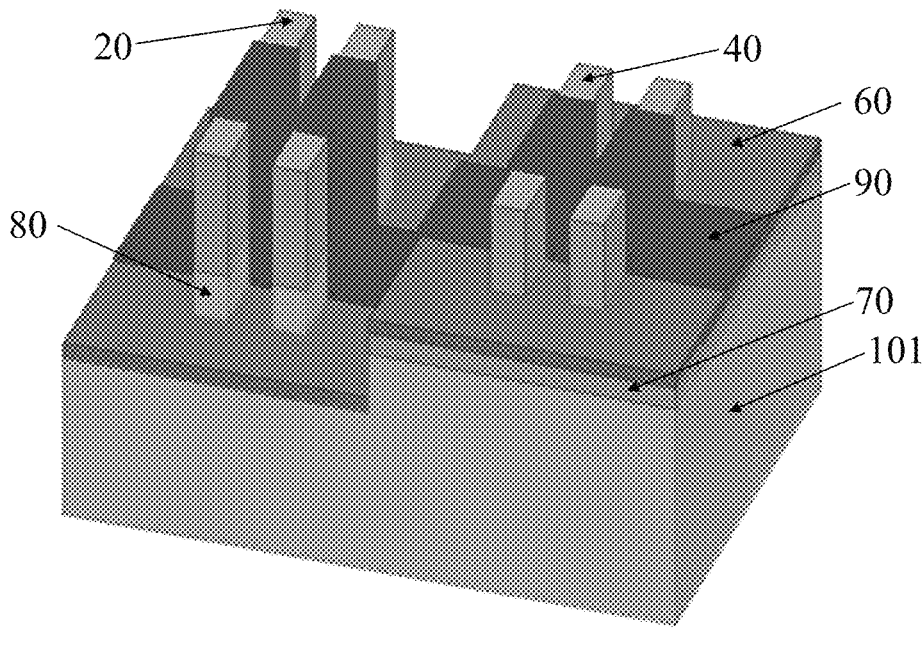

In step 4.4, referring to FIG. 4d, a gate dielectric layer 90 is formed on top and sidewall surfaces of each of the first fin 20 and the second fin 40. For example, a material of the gate dielectric layer 90 is a high-k dielectric or $SiO_2$.

Figure 4E:
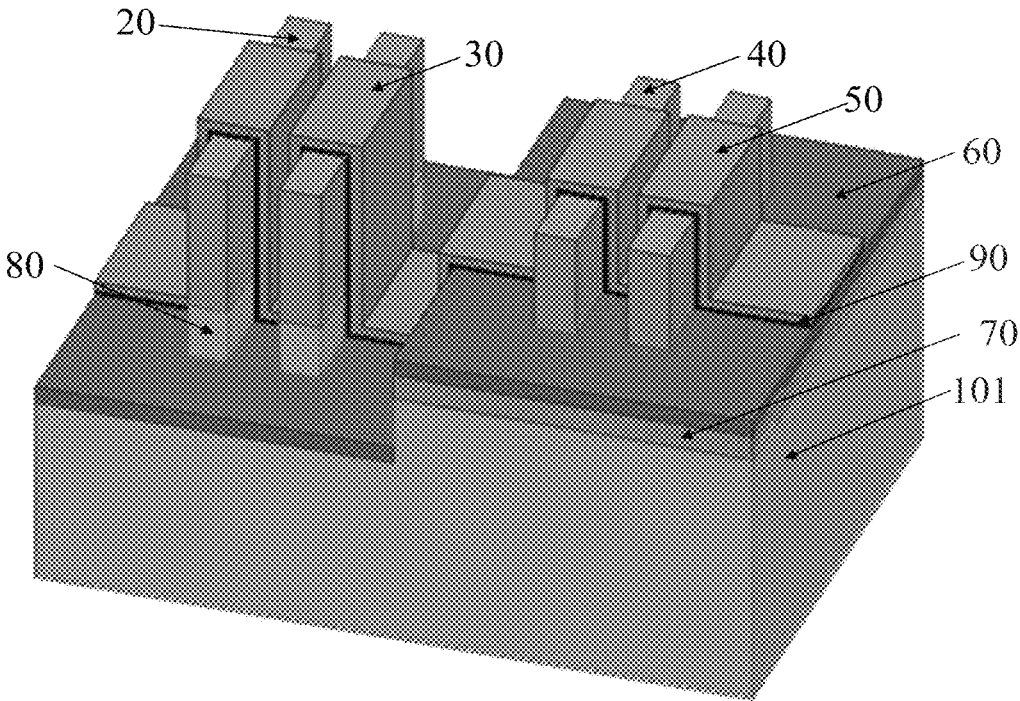

In step 4.5, referring to FIG. 4e, gate electrode material is deposited on the gate dielectric layer 90 and etched to form the first gate electrode 30 and the second gate electrode 50.

Figure 4F:
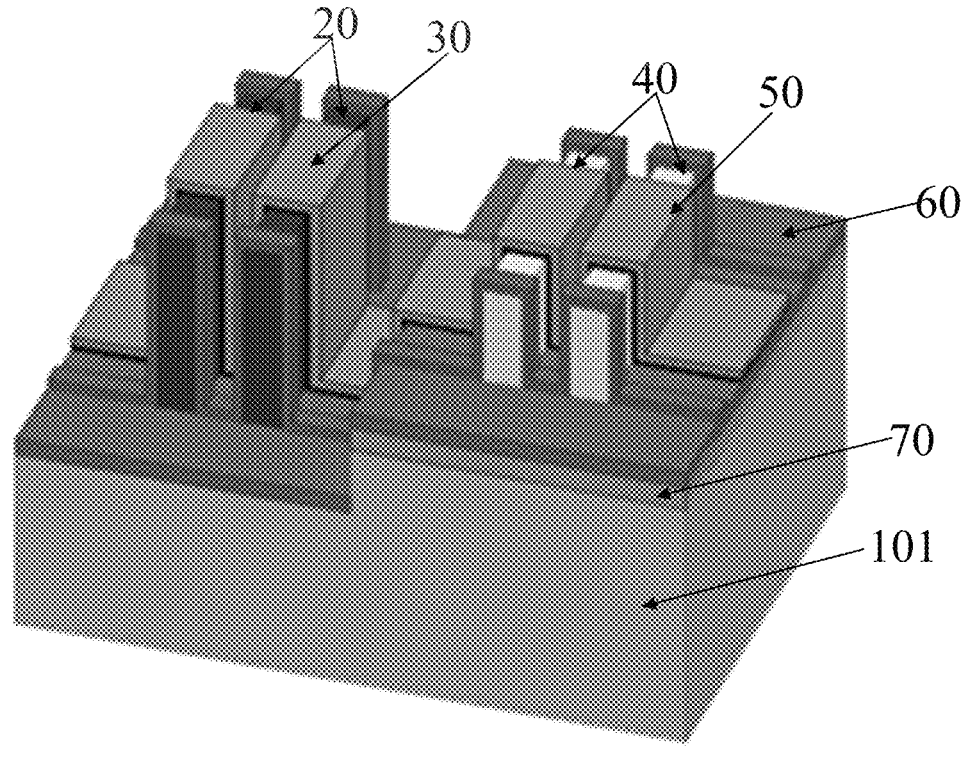

In step 4.6, referring to FIG. 4f, n-type doping or epitaxy is performed on the both sides of first channel region of the nMOS to form the first source region and the first drain region, p-type doping or epitaxy is performed on both sides of the second channel region of the pMOS to form the second source region and the second drain region, and finally, metallized connection is achieved.

Fifth Embodiment

Figure 5:
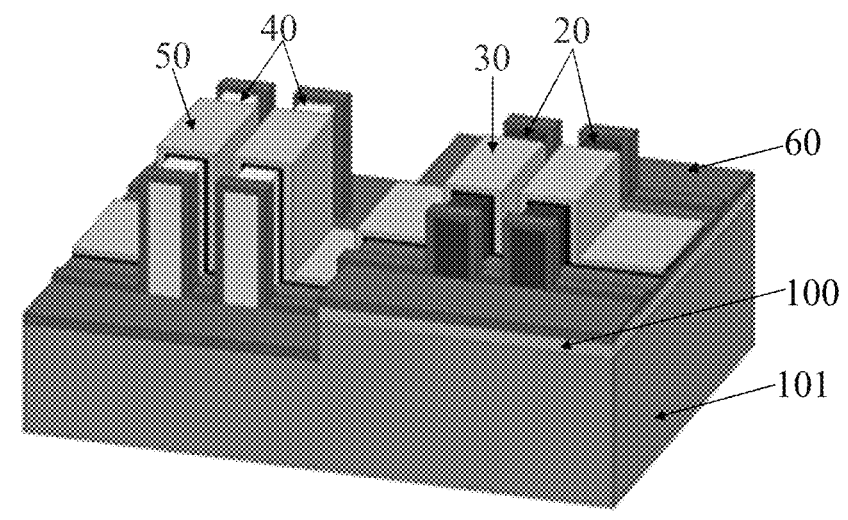
FIG. 5 illustrates a schematic structural view of another bulk-silicon-substrate-based FinFET CMOS according to an embodiment of the present disclosure.

Referring to FIG. 5, FIG. 5 illustrates the schematic structural view of another bulk-silicon-substrate-based Fin-FET CMOS according to an embodiment of the present disclosure. The present disclosure also provides another FinFET CMOS fabricated on bulk silicon on the basis of the second and third embodiments. An nMOS of the FinFET CMOS includes at least one first fin 20 formed on the bulk silicon, and a pMOS of the FinFET CMOS includes at least one second fin 40 formed on the bulk silicon. A Si substrate layer 101 of the bulk silicon is an n-type material, and a Si epitaxial layer of the bulk silicon is a p-type material. Materials of the first fin 20 and the second fin 40 are p-type semiconductor materials with the same doping concentration. Further, a first insulating layer 60 is formed on the bulk silicon. A first gate electrode 30 of the nMOS and a second gate electrode 50 of the pMOS are formed of the conductive materials with the same work function, and a gate dielectric layer is formed between the gate electrodes and the fins.

In addition, a p-type semiconductor layer 100 with the same doping concentration as the first fin 20 may be formed under the first fin 20 of the nMOS, which is beneficial to the design and performance of the FinFET CMOS.

Referring to FIGS. 6a to 6f, FIGS. 6a to 6f illustrate the schematic views of the fabrication process of another bulk-silicon-substrate-based FinFET CMOS according to an embodiment of the present disclosure. Based on the above contents, this embodiment also provides a fabrication method of the FinFET CMOS on bulk silicon, which includes following steps 5.1 to 5.6.

In step 5.1, bulk silicon is provided.

Figure 6A:
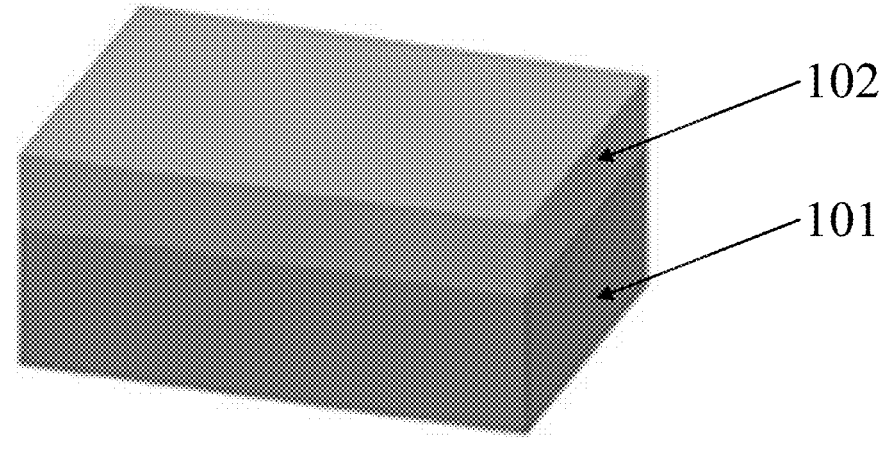
FIGS. 6a to 6f illustrate schematic views of a fabrication process of another bulk-silicon-substrate-based FinFET CMOS according to an embodiment of the present disclosure.

Referring to FIG. 6a, a Si substrate layer 101 of the bulk silicon is formed of an n-type material and a Si epitaxial layer 102 of the bulk silicon is formed of a p-type material.

Figure 6B:
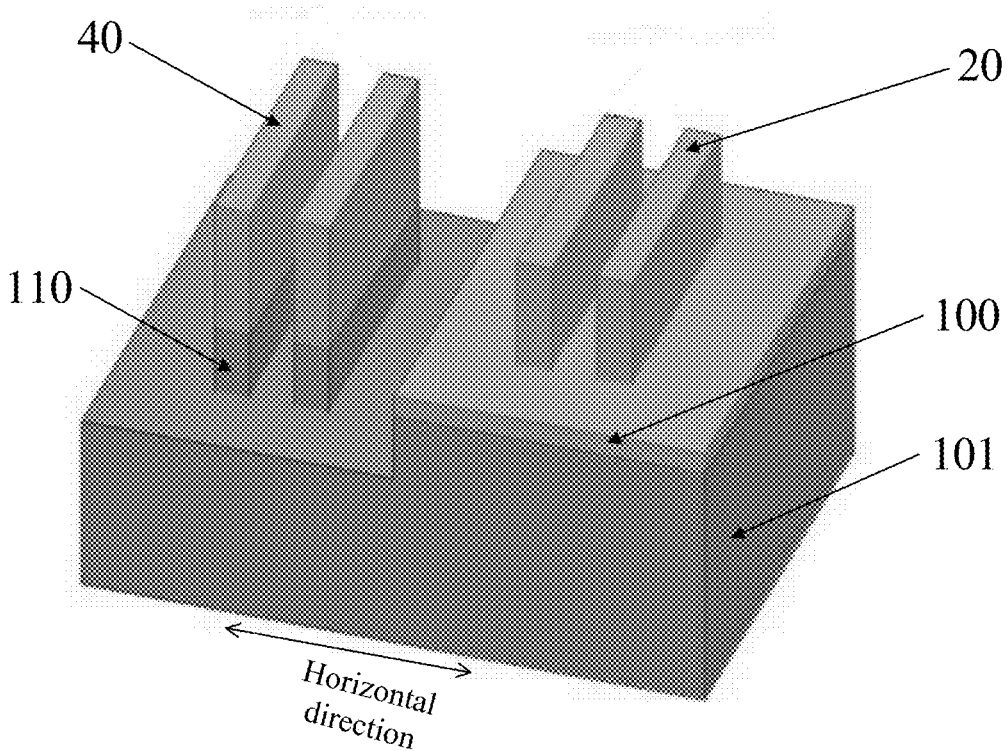
Figure 6C:
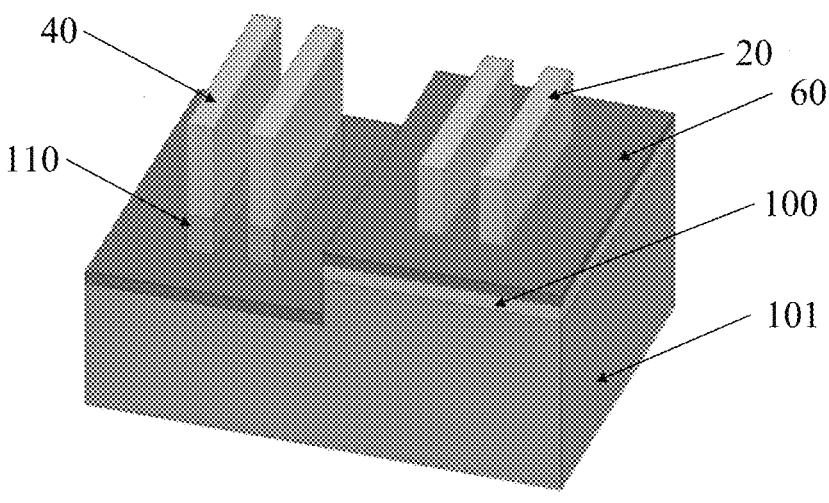

In step 5.2, referring to FIG. 4b, the Si epitaxial layer 102 of the bulk silicon is etched to form a first fin 20 and a second fin 40, and a portion of a certain thickness of the Si epitaxial layer 102 should be reserved under all the first fin 20 of the pMOS, and the reserved Si epitaxial layer 102 is used as the p-type semiconductor layer 100. When the second fin 40 is formed by etching, the bulk silicon can be etched to the Si substrate layer 101, therefore, a second transition structure 110 whose cross section having the same or similar shape and dimension as a preset cross section of each of the second fin 40 is reserved at a lower part of the second fin 40 of the pMOS. A material of the second transition structure 110 is an n-type semiconductor material. The preset cross section is a cross section in a horizontal direction as shown in FIG. 6b, and this design solution is beneficial to the design and performance of the FinFET CMOS;

In step 5.3, referring to FIG. 6c, a first insulating layer 60 is formed on other portion of the bulk silicon except the portion where the first fin 20 and the second fin 40 are formed.

Figure 6D:
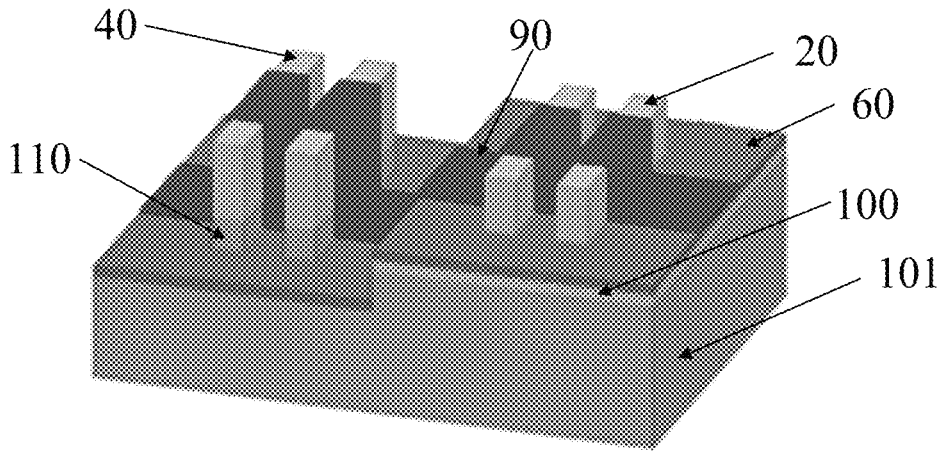

In step 5.4, referring to FIG. 6d, a gate dielectric layer 90 is formed on the top and sidewall surfaces of each of the first fin 20 and the second fin 40.

Figure 6E:
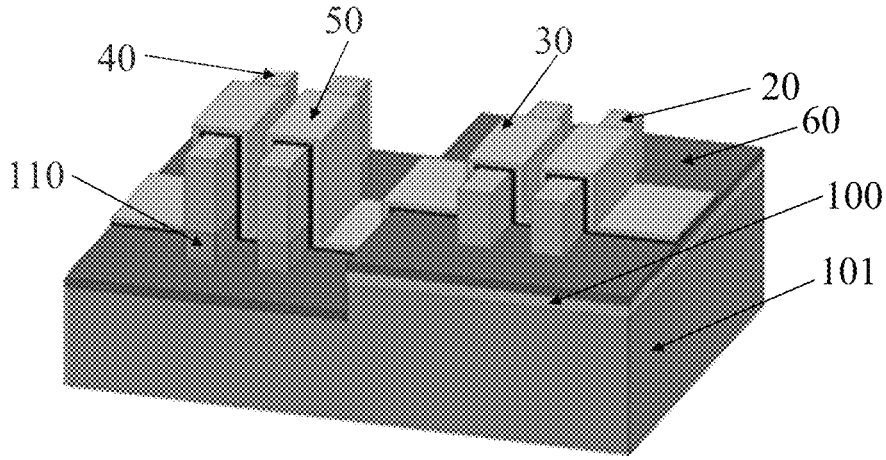

In step 5.5, referring to FIG. 6e, a gate electrode material is deposited and etched on the gate dielectric layer 90 to form the first gate electrode 30 and the second gate electrode 50.

Figure 6F:
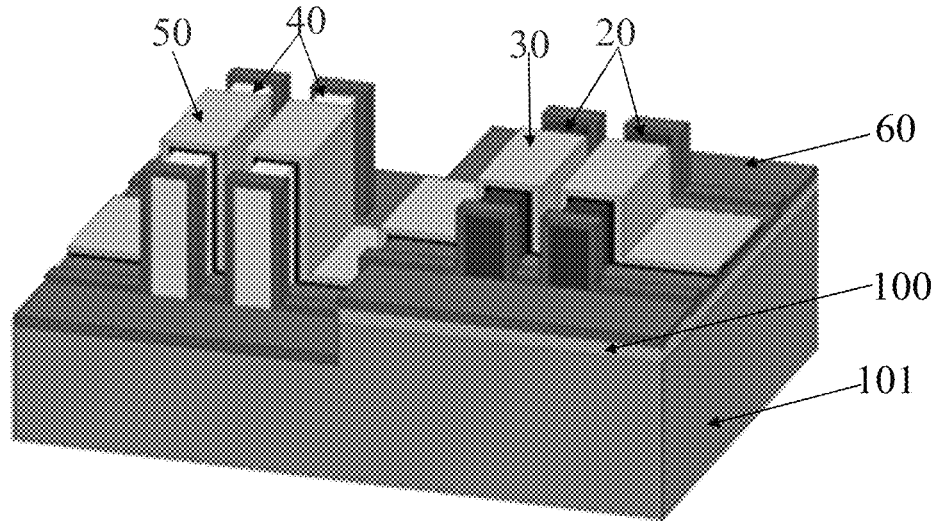

In step 5.6, referring to FIG. 6f, n-type doping or epitaxy is performed on the both sides of a first channel region of the nMOS to form a first source region and a first drain region, p-type doping or epitaxy on both sides of a second channel region of the pMOS is performed to form a second source region and a second drain region, and finally, metallized connection is achieved.

Sixth Embodiment

Figure 7:
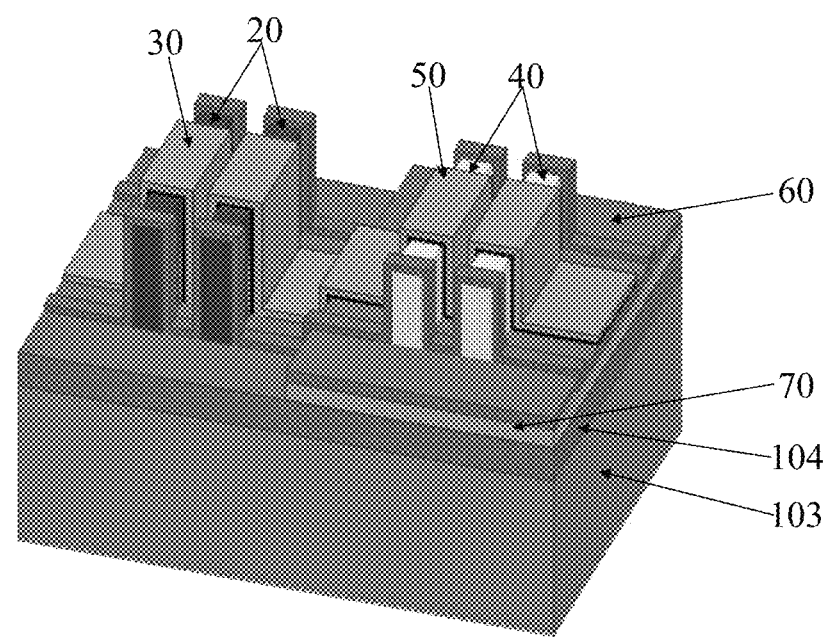
FIG. 7 illustrates a schematic structural view of an SOI-substrate-based FinFET CMOS according to an embodiment of the present disclosure.

Referring to FIG. 7, FIG. 7 illustrates the schematic structural view of an SOI-substrate-based FinFET CMOS according to an embodiment of the present disclosure. This embodiment also provides a FinFET CMOS fabricated on an SOI on the basis of the second and third embodiments, that is to say, the semiconductor substrate 10 of this embodiment is the SOI, an nMOS of the FinFET CMOS includes at least one first fin 20 formed on the SOI, and a pMOS of the FinFET CMOS includes at least one second fin 40 formed on the SOI. The SOI includes a substrate layer 103, a second insulating layer 104 and surface silicon stacked in sequence, where the surface silicon is formed of an n-type material, the first fin 20 and the second fin 40 are formed of the surface silicon, and materials of the first fin 20 and the second fin 40 are n-type semiconductor materials with the same doping concentration. Moreover, a first gate electrode 20 of the nMOS and a second gate electrode 50 of the pMOS are formed of the conductive materials with the same work function, and a gate dielectric layer is also formed between the gate electrodes and the fins.

Referring to FIGS. 8a to 8e, FIGS. 8a to 8e illustrate schematic views of a fabrication process of the SOI-substrate-based FinFET CMOS according to an embodiment of the present disclosure. Based on the above contents, this embodiment also provides a fabrication method of a FinFET CMOS on an SOI, which includes following steps 6.1 to 6.6.

In step 6.1, an SOI is provided.

Figure 8A:
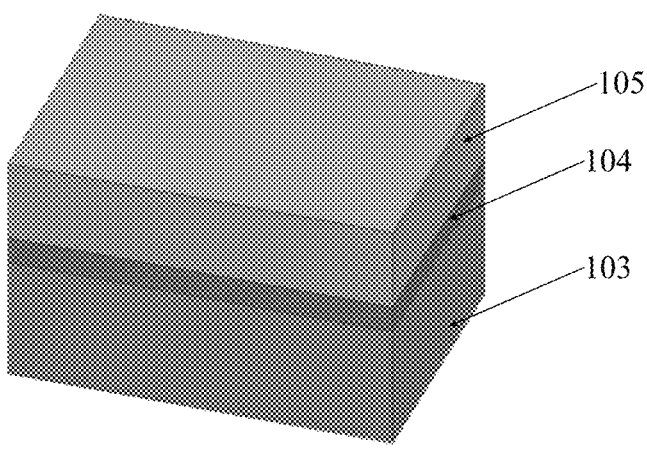
FIGS. 8a to 8e illustrate schematic views of a fabrication process of the SOI-substrate-based FinFET CMOS according to an embodiment of the present disclosure.

Referring to FIG. 8a, the SOI includes a substrate layer 103, a second insulating layer 104, and a surface silicon 105. The surface silicon is an n-type material.

Figure 8B:
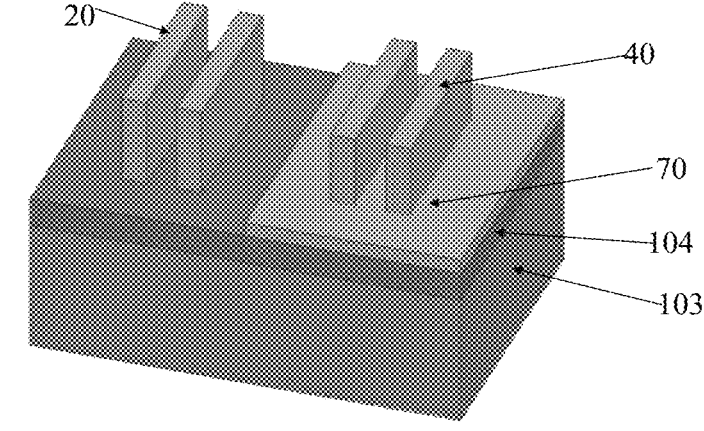
Figure 8C:
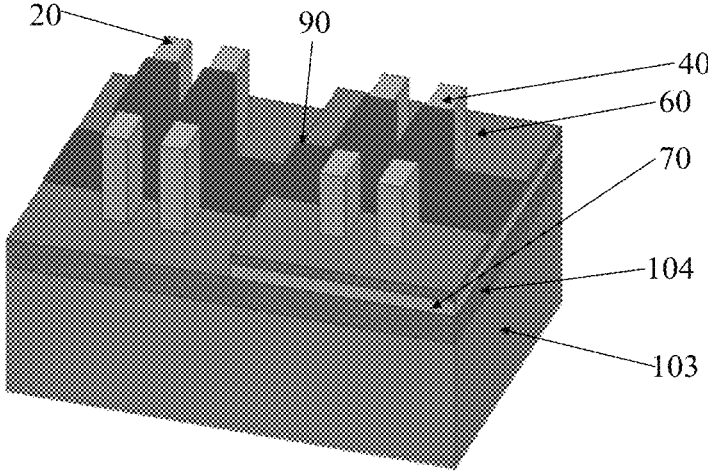

In step 6.2, referring to FIG. 8b, the surface silicon 105 of the SOI is etched to form the first fin 20 and the second fin 40, and an n-type semiconductor layer 70 is formed below all of the second fin 40 of the pMOS;

In step 6.3, referring to FIG. 8c, a first insulating layer 60 is formed on the other portion of the n-type semiconductor layer 70 except the portion where the second fin 40 is formed;

In step 6.4, a gate dielectric layer 90 is formed on the top and sidewall surfaces of each of the first fin 20 and the second fin 40.

Figure 8D:
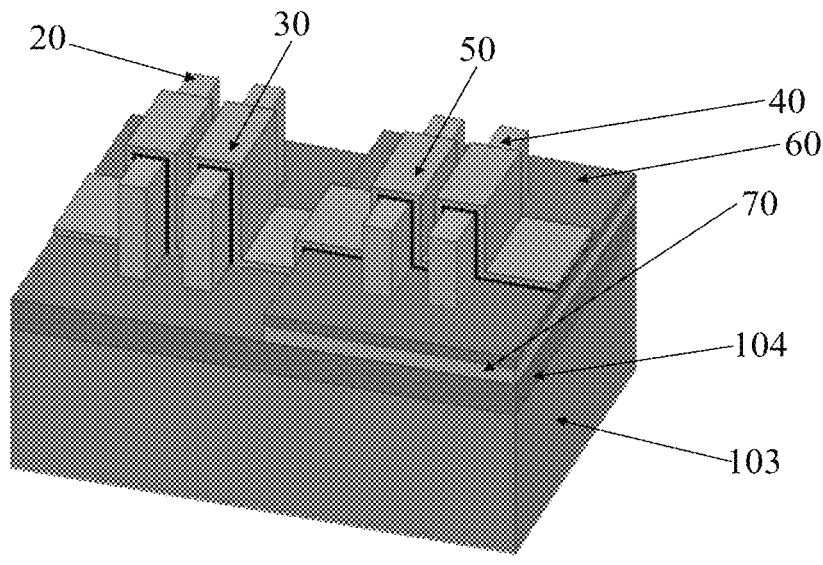

In step 6.5, referring to FIG. 8d, a gate electrode material is deposited on the gate dielectric layer 90 and etched to form a first gate electrode 30 and a second gate electrode 50.

Figure 8E:
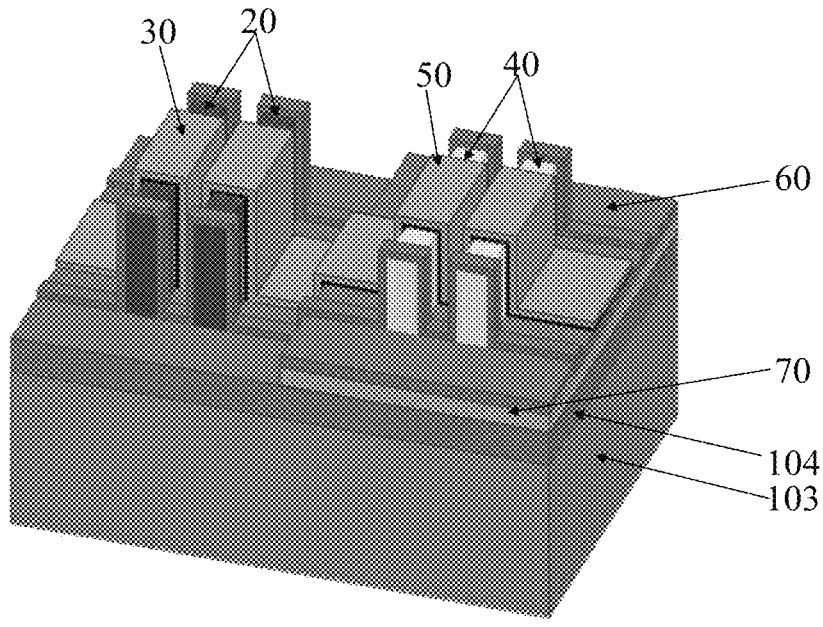

In step 6.6, please referring to FIG. 8e, n-type doping or epitaxy is performed on both sides of a first channel region of the nMOS to form a first source region and a first drain region, p-type doping or epitaxy is performed on both sides of a second channel region of the pMOS to form a second source region and a second drain region, and finally, metallized connection is achieved.

Seventh Embodiment

Figure 9:
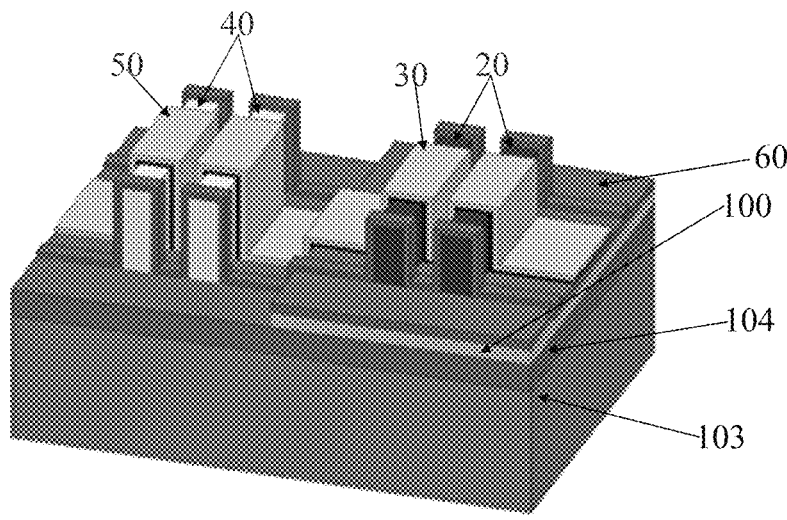
FIG. 9 illustrates a schematic structural view of another SOI-substrate-based FinFET CMOS according to an embodiment of the present disclosure.

Referring to FIG. 9, FIG. 9 illustrates a schematic structural view of another SOI-substrate-based FinFET CMOS according to an embodiment of the present disclosure. This embodiment also provides another FinFET CMOS fabricated on an SOI on the basis of the second and third embodiments. An nMOS of the FinFET CMOS includes at least one first fin 20 formed on the SOI, and a pMOS of the FinFET CMOS includes at least one second fin 40 formed on the SOI. A surface silicon of the SOI is formed of a p-type material, and materials of the first fin 20 and the second fin 40 are p-type semiconductor materials with the same doping concentration. A first gate electrode 20 of the nMOS and a second gate electrode 50 of the pMOS are formed of the conductive materials with the same work function, and a gate dielectric layer is formed between the gate electrodes and the fins.

In addition, a p-type semiconductor layer 100 with the same doping concentration as the first fin 20 may be formed under the first fin 20 of the nMOS. A first insulating layer 60 is formed on other portion of the p-type semiconductor layer 100 except the portion where the first fin 20 is formed;

Referring to FIGS. 10a to 10e, FIGS. 10a to 10e illustrate the schematic views of a fabrication process of another SOI-substrate-based FinFET CMOS according to an embodiment of the present disclosure. Based on the above contents, this embodiment also provides a fabrication method of a FinFET CMOS on an SOI, which includes following steps 7.1 to 7.6.

In step 7.1, an SOI is provided.

Figure 10A:
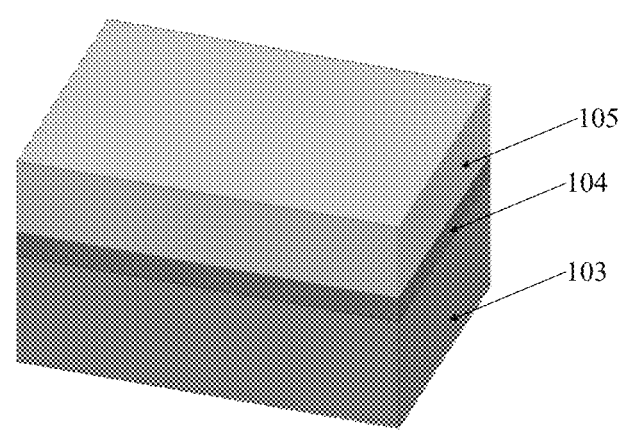
FIGS. 10a to 10e illustrate schematic views of a fabrication process of another SOI-substrate-based FinFET CMOS according to an embodiment of the present disclosure.

Referring to FIG. 10a, a surface silicon 105 of the SOI is a p-type material.

Figure 10B:
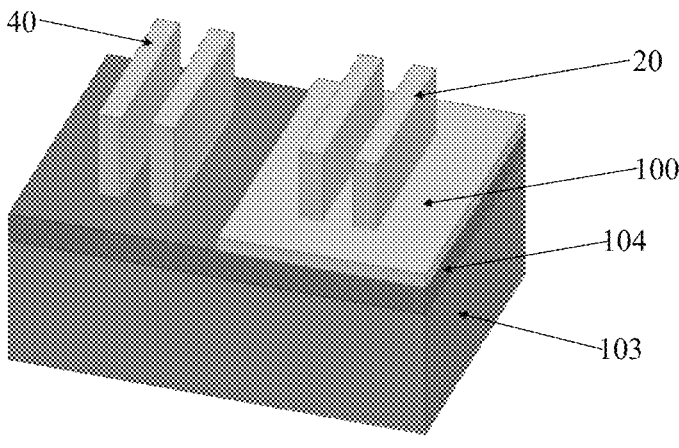

In step 7.2, referring to FIG. 10b, the surface silicon 105 of the SOI is etched to form the first fin 20 and the second fin 40, and a p-type semiconductor layer 100 is formed below all of the first fin 20 of the nMOS.

Figure 10C:
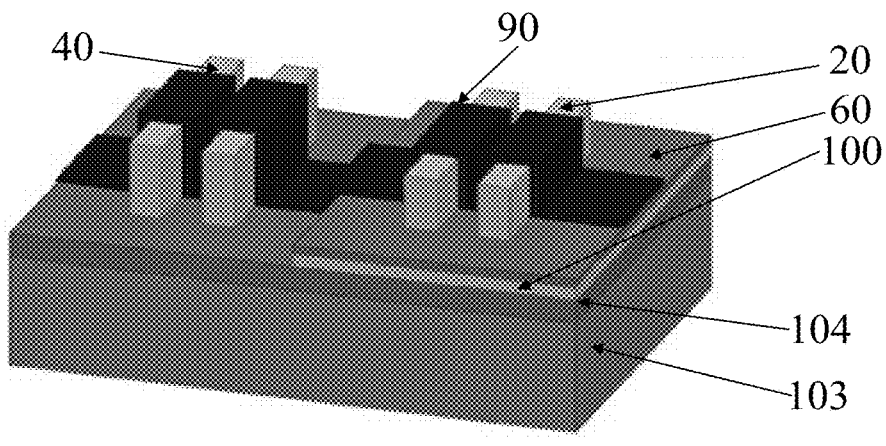

In step 7.3, referring to FIG. 10c, a first insulating layer 60 is formed on other portion of the p-type semiconductor layer 100 except the portion where the first fin 20 is formed;

In step 7.4, a gate dielectric layer 90 is formed on the top and sidewall surfaces of the first fin 20 and the second fin 40.

Figure 10D:
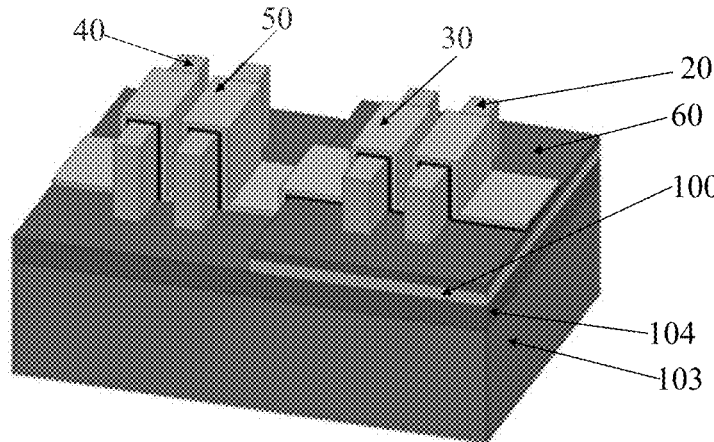

In step 7.5, referring to FIG. 10d, a gate electrode material is deposited on the gate dielectric layer 90 and etched to form a first gate electrode 30 and a second gate electrode 50.

Figure 10E:
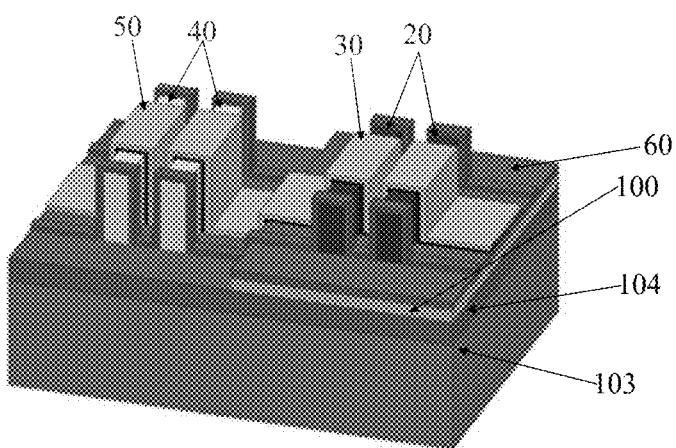

In step 7.6, referring to FIG. 10e, n-type doping or epitaxy is performed on the both sides of a first channel region of the nMOS to form a first source region and a first drain region, p-type doping or epitaxy is performed on both sides of the second channel region of the pMOS to form a second source region and a second drain region, and finally, metallized connection is achieved.

Eighth Embodiment

Figure 11:
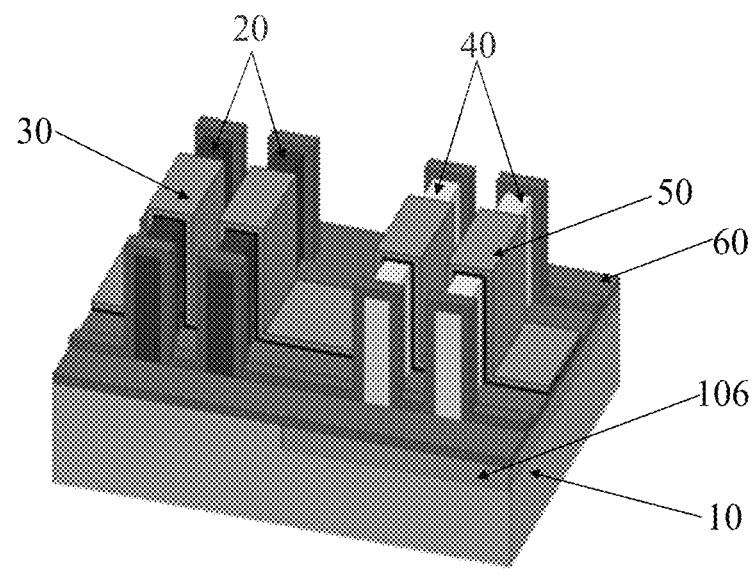
FIG. 11 illustrates a schematic structural view of a p-type-semiconductor-substrate-based FinFET CMOS according to an embodiment of the present disclosure.

Referring to FIG. 11, FIG. 11 illustrates the schematic structural view of a p-type-semiconductor-substrate-based FinFET CMOS according to an embodiment of the present disclosure. The present disclosure also provides a FinFET CMOS fabricated on a p-type semiconductor substrate on the basis of the second and third embodiments, that is to say, the semiconductor substrate 10 of this embodiment is a p-type semiconductor substrate, and an n-type region 106 is formed in the p-type semiconductor substrate. An nMOS of the FinFET CMOS includes at least one first fin 20 formed on the p-type semiconductor substrate, and a pMOS of the FinFET CMOS includes at least one second fin 40 formed on the n-type region 106. An n-type epitaxial layer is formed on the p-type semiconductor substrate. Materials of the first fin 20 and the second fin 40 are n-type semiconductor materials with the same doping concentration. A first gate electrode 30 of the nMOS and a second gate electrode 50 of the pMOS are formed of the conductive materials with the same work function, and a gate dielectric layer is provided between the gate electrodes and the fins.

Referring to FIGS. 12a to 12f, FIGS. 12a to 12f illustrate the schematic views of a fabrication process of the p-type-semiconductor-substrate-based FinFET CMOS according to an embodiment of the present disclosure. Based on the above contents, this embodiment also provides a fabrication method of the FinFET CMOS on a p-type semiconductor substrate, which includes the following steps 8.1 to 8.6.

In step 8.1, a p-type semiconductor substrate is provided.

Figure 12A:
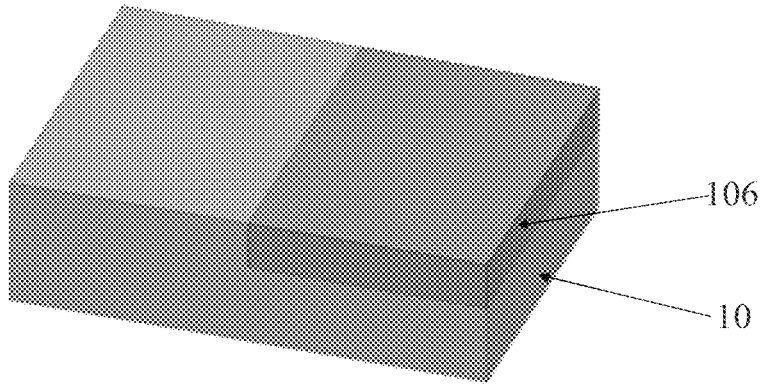
FIGS. 12a to 12g illustrate schematic views of a fabrication process of the p-type-semiconductor-substrate-based FinFET CMOS according to an embodiment of the present disclosure.

Referring to FIG. 12*a*, the semiconductor substrate 10 is the p-type semiconductor substrate, and an n-type region 106 is provided in the p-type semiconductor substrate. For example, the p-type semiconductor substrate is a p-type Si substrate.

Figure 12B:
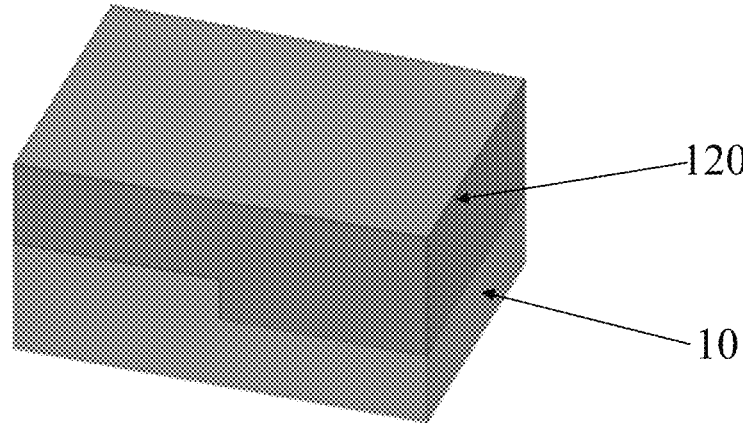

In step 8.2, referring to FIG. 12*b*, an n-type epitaxial layer 120 is fabricated on the p-type semiconductor substrate and the n-type region 106. For example, the n-type epitaxial layer 120 is an n-type Si layer.

Figure 12C:
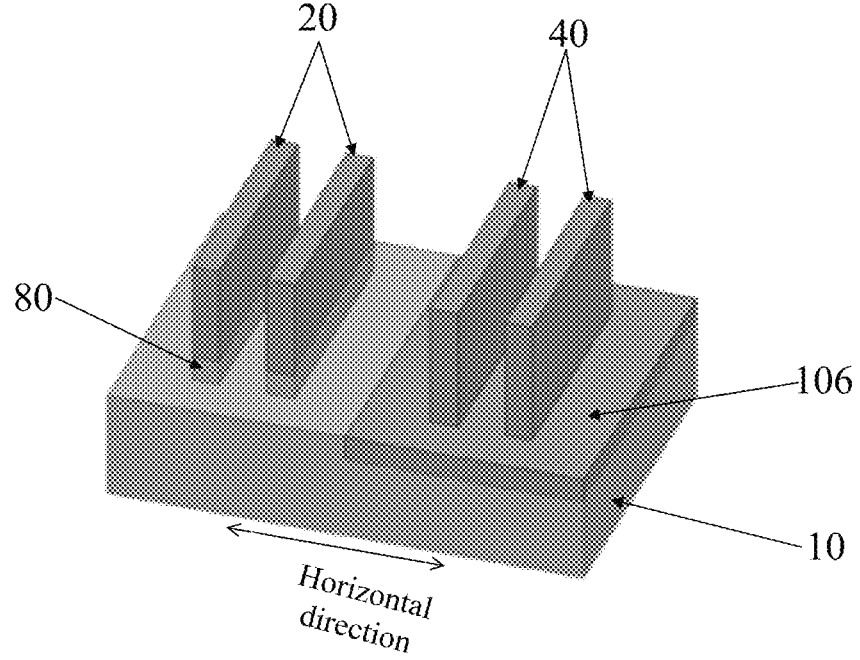

In step 8.3, referring to FIG. 12*c*, the n-type epitaxial layer 120 is etched to form the first fin 20 and second fin 40. When the second fin 40 of the pMOS is formed, an upper surface of the n-type region 106 is etched, while a portion of the n-type region 106 is still reserved below each second fin 40. When the first fin 20 is formed, the etching process is performed inside the p-type semiconductor substrate (a portion of the p-type semiconductor substrate is etched) such that a first transition structure 80 with the same or similar shape and dimension as a preset cross section of each first fin 20 is reserved at a lower part of the first fin 20 of the nMOS. The material of the first transition structure 80 is a p-type semiconductor material, and the preset cross section is a cross section in a horizontal direction as shown in FIG. 12*c*.

Figure 12D:
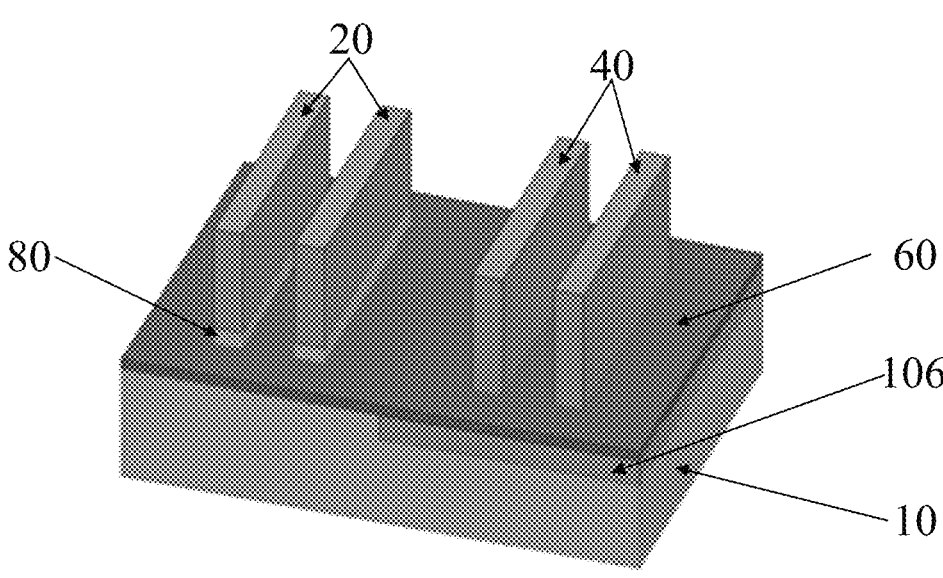

In step 8.4, referring to FIG. 12*d*, a first insulating layer 60 is provided without covering the first fin 20 and the second fin 40.

Figure 12E:
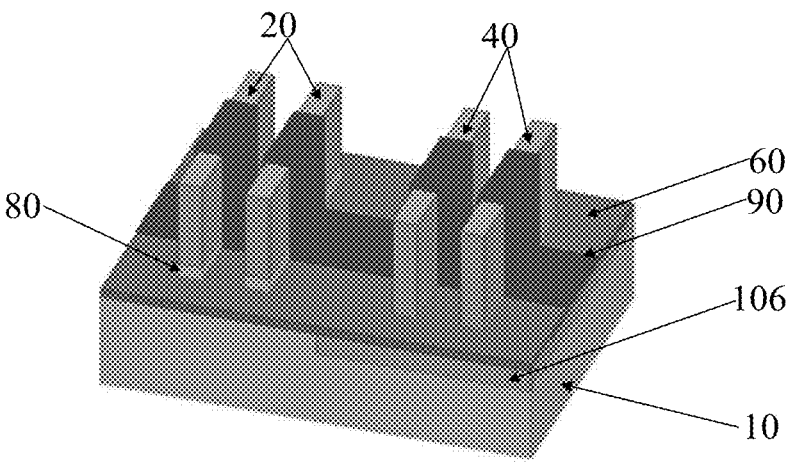

In step 8.5, referring to FIG. 12*e*, a gate dielectric layer 90 is formed on the top and sidewall surfaces of each of the first fin 20 and the second fin 40.

Figure 12F:
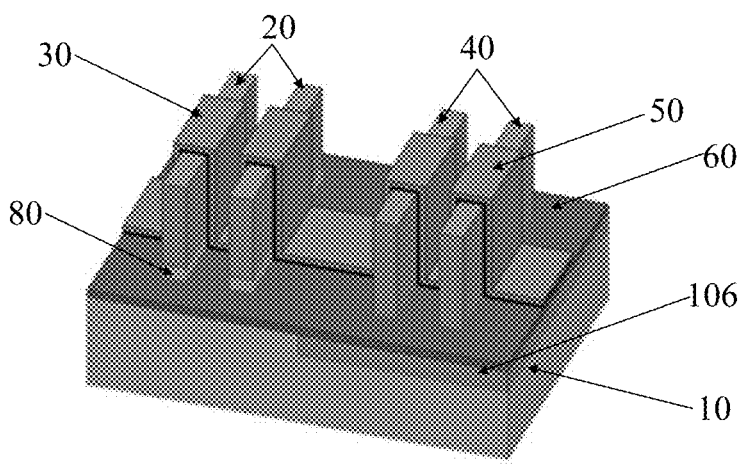

In step 8.6, referring to FIG. 12*f*, a gate electrode material is deposited on the gate dielectric layer 90 and etched to form a first gate electrode 30 and a second gate electrode 50.

Figure 12G:
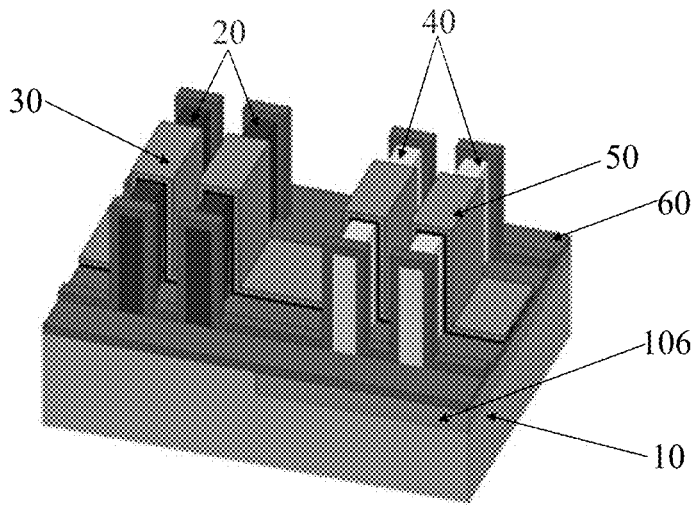

In step 8.7, referring to FIG. 12*g*, n-type doping or epitaxy is performed on the both sides of a first channel region of the nMOS to form a first source region and a first drain region, and p-type doping or epitaxy is performed on the both sides of the second channel region of the pMOS to form a second source region and a second drain region, and finally, metallized connection is achieved.

Ninth Embodiment

Figure 13:
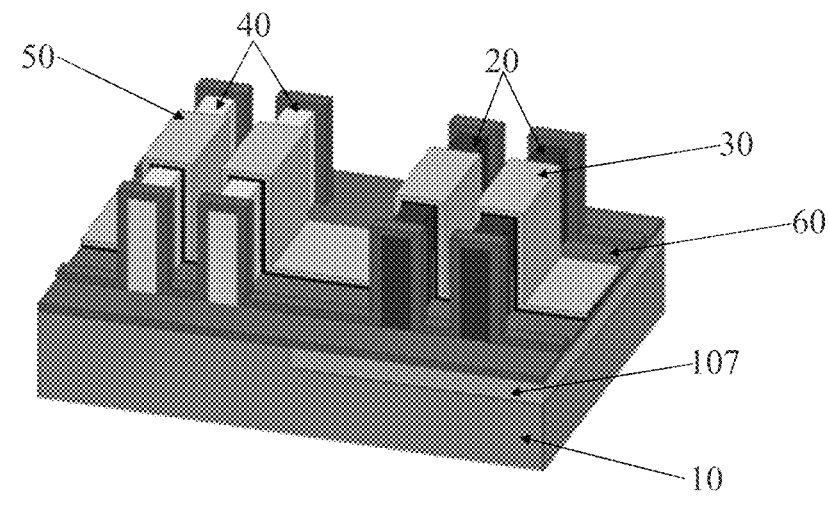
FIG. 13 illustrates a schematic structural view of an n-type-semiconductor-substrate-based FinFET CMOS according to an embodiment of the present disclosure.

Referring to FIG. 13, FIG. 13 illustrates the schematic structural view of an n-type-semiconductor-substrate-based FinFET CMOS according to an embodiment of the present disclosure. The present disclosure also provides a FinFET CMOS fabricated on an n-type semiconductor substrate on the basis of the second and third embodiments, that is to say, the semiconductor substrate 10 of this embodiment is an n-type semiconductor substrate, and a p-type region 107 is formed in the n-type semiconductor substrate. An nMOS of the FinFET CMOS includes at least one first fin 20 formed on the p-type semiconductor substrate 107, and a pMOS of the FinFET CMOS includes at least one second fin 40 formed on the n-type semiconductor substrate 10. A p-type epitaxial layer is formed on the n-type semiconductor substrate. Materials of the first fin 20 and the second fin 40 are p-type semiconductor materials with the same doping concentration. The first gate electrode 30 of the nMOS and a second gate electrode 50 of the pMOS are formed of the conductive materials with the same work function, and the gate dielectric layer is provided between the gate electrodes and the fins.

Referring to FIGS. 14*a* to 14*g*, FIGS. 14*a* to 14*g* illustrate the schematic views of a fabrication process of the n-type-semiconductor-substrate-based FinFET CMOS according to an embodiment of the present disclosure. Based on the above contents, this embodiment also provides a fabrication method of the FinFET CMOS on an n-type semiconductor substrate, which includes following steps 9.1-9.7.

In step 9.1, an n-type semiconductor substrate is provided.

Figure 14A:
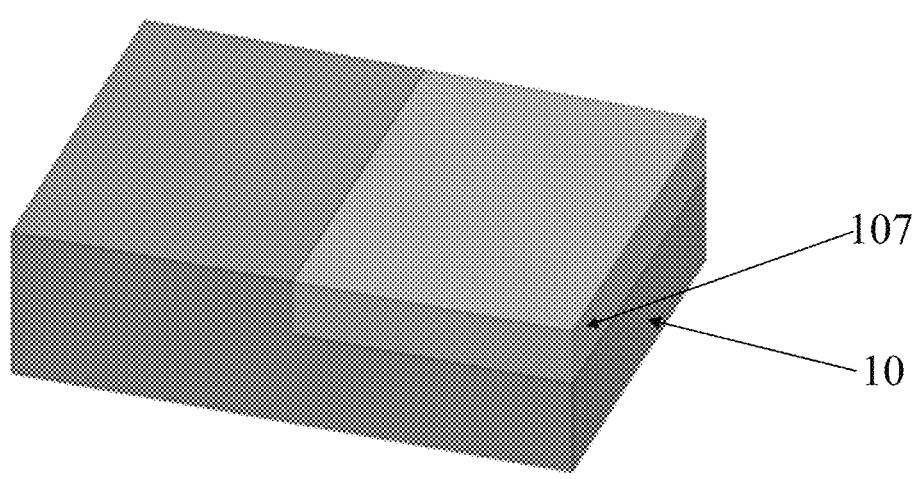
FIGS. 14a to 14g illustrate schematic views of a fabrication process of the n-type-semiconductor-substrate-based FinFET CMOS according to an embodiment of the present disclosure.

Referring to FIG. 14*a*, the semiconductor substrate 10 is the n-type semiconductor substrate, and a p-type region 107 is provided in the n-type semiconductor substrate. For example, the n-type semiconductor substrate is an n-type Si substrate.

Figure 14B:
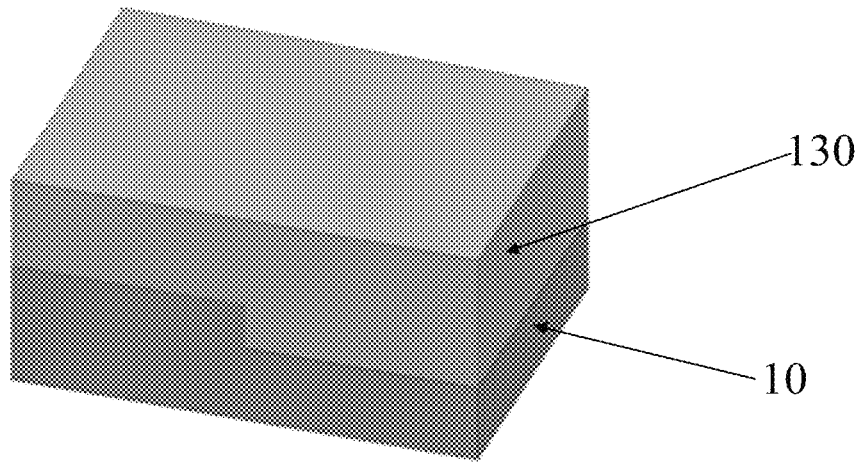

In step 9.2, referring to FIG. 14*b*, a p-type epitaxial layer 130 is fabricated on the n-type semiconductor substrate and the p-type region 107. For example, the p-type epitaxial layer 130 is a p-type Si layer.

Figure 14C:
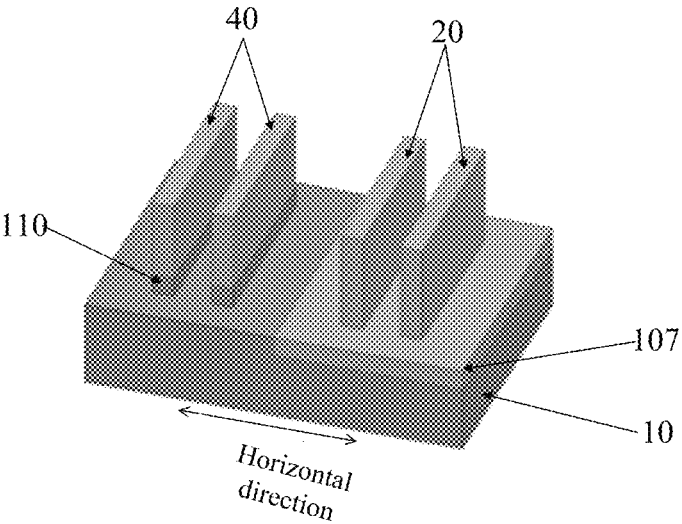

In step 9.3, referring to FIG. 14*c*, the p-type epitaxial layer 130 is etched to form the first fin 20 and second fin 40. When the first fin 20 of the nMOS is formed, an upper surface of the p-type region 107 is etched, while a portion of the p-type region 107 is still reserved below each of the first fin 20. When the second fin 40 is formed, the etching process is performed inside the n-type semiconductor substrate (a portion of the n-type semiconductor substrate is etched) such that a second transition structure 110 with the same or similar shape and dimension as a preset cross section of each of the second fin 40 is reserved at a lower part of the second fin 40 of the pMOS. A material of the second transition structure 110 is an n-type semiconductor material, and the preset cross section is a cross section in a horizontal direction as shown in FIG. 14*c*.

Figure 14D:
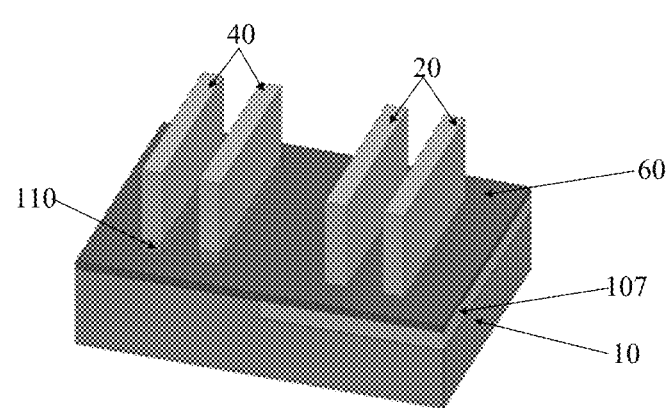

In step 9.4, referring to FIG. 14*d*, a first insulating layer 60 is provided without covering the first fin 20 and the second fin 40.

Figure 14E:
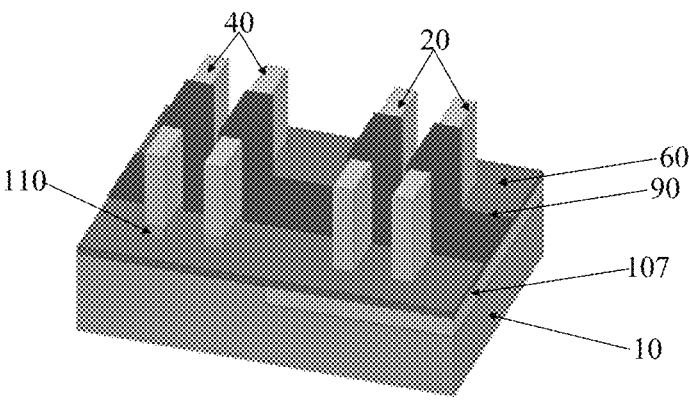

In step 9.5, referring to FIG. 14*e*, the gate dielectric layer 90 is formed on the top and sidewall surfaces of the first fin 20 and the second fin 40.

Figure 14F:
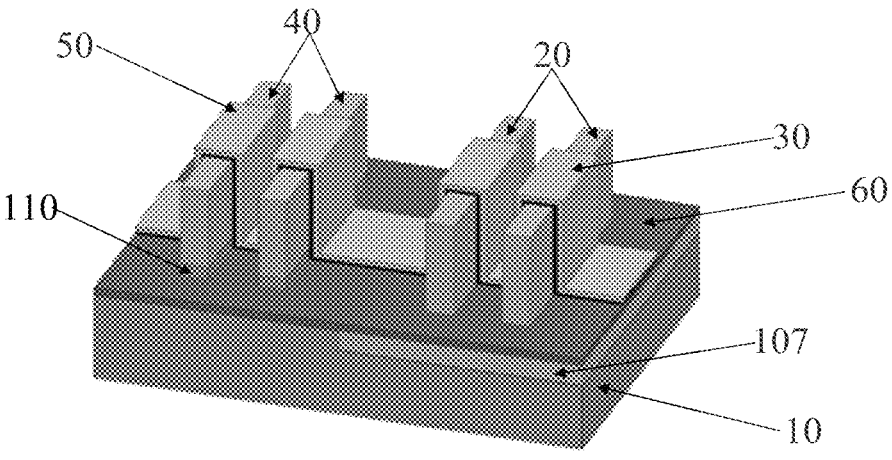

In step 9.6, referring to FIG. 14*f*, the gate electrode material is deposited on the gate dielectric layer 90 and etched to form a first gate electrode 30 and a second gate electrode 50.

Figure 14G:
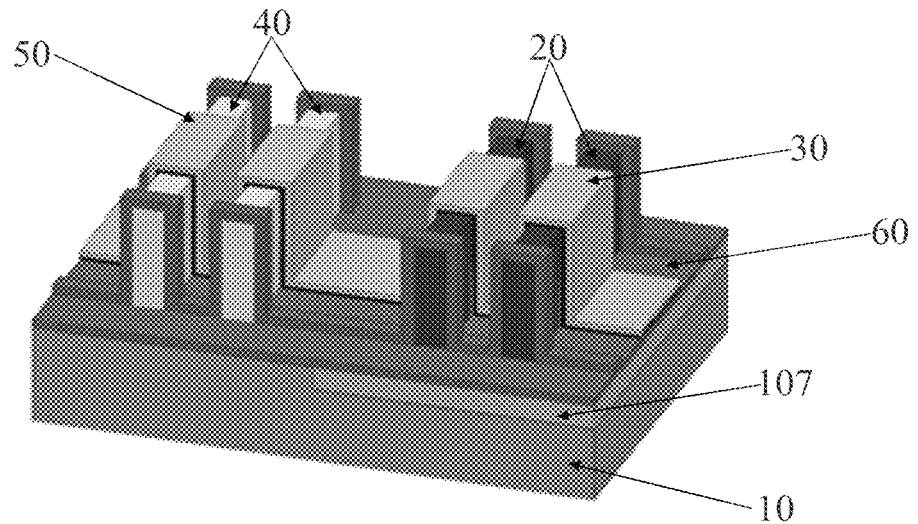

In step 9.7, referring to FIG. 14*g*, n-type doping or epitaxy is performed on the both sides of a first channel region of the nMOS to form a first source region and a first drain region, and p-type doping or epitaxy is performed on the both sides of the second channel region of the pMOS to form a second source region and a second drain region, and finally achieve metallized connection.

Tenth Embodiment

Figure 15:
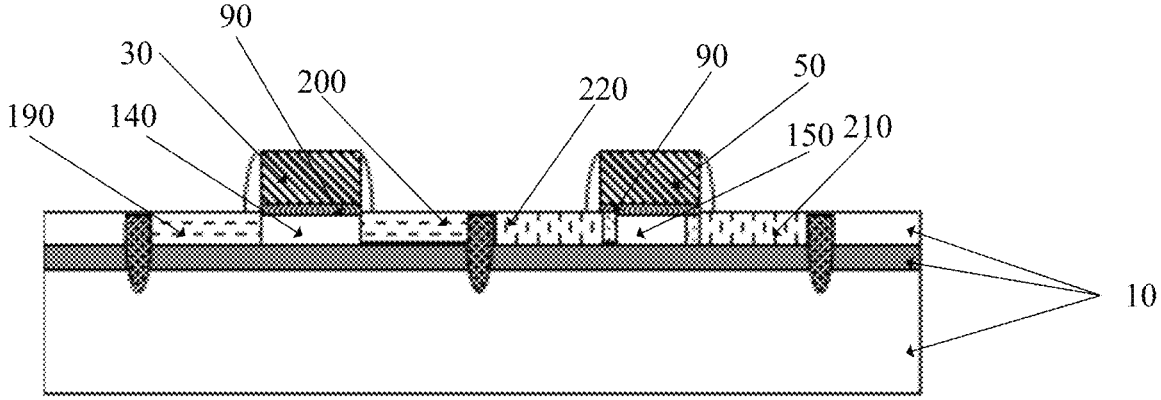
FIG. 15 illustrates a schematic structural view of an FD CMOS according to an embodiment of the present disclosure.

Referring to FIG. 15, FIG. 15 illustrates the schematic structural view of an FD CMOS according to an embodiment of the present disclosure. On the basis of the first embodiment, this embodiment provides the FD CMOS, a semiconductor substrate 10 of the FD CMOS includes a substrate layer, an insulating layer and a top semiconductor layer sequentially stacked. An nMOS of the FD CMOS includes first channel regions 140 formed by the top semiconductor layer of the semiconductor substrate 10, and first gate electrodes 30 formed on the first channel regions 140.

A pMOS of the FD CMOS includes second channel regions 150 formed by the top semiconductor layer of the semiconductor substrate 10, and second gate electrodes 50 formed on the second channel regions 150. Specifically, the first channel regions 140 and the second channel regions 150 are formed on the top semiconductor layer with the same conductivity type. Further, the first gate electrodes 30 and the second gate electrodes 50 are formed of the conductive materials with the same work function. It should be emphasized that thickness and doping concentration of the top semiconductor layer should meet the requirement of complete depletion under the work functions of the gate electrodes.

Specifically, when materials of the first channel regions 140 and the second channel regions 150 are n-type semiconductor materials with the same doping concentration, it is preferable that the work functions of the first gate electrodes 30 and the second gate electrodes 50 is in a range from 4.6 eV to 5.1 eV. When the materials of the first channel regions 140 and the second channel regions 150 are p-type semiconductor materials with the same doping concentration, it is preferable that the work functions of the first gate electrodes 30 and the second gate electrodes 50 is in a range from 4.1 eV to 4.5 eV. A specific value of the work function of the gate electrodes depends on parameters such as thickness and doping concentration of the top semiconductor layer, which is not limited herein.

In this embodiment, the semiconductor substrate 10 is preferably an SOI, and the top semiconductor layer may also be one selected from the group consisting of Si, SiGe, Ge, SiC and III-IV groups.

In this embodiment, the channel regions of the nMOS and the pMOS are fabricated in the top semiconductor layer with the same conductivity type and having the same or similar doping concentration, preferably the same doping concentration, so that it is not necessary to specially fabricate an n-type region (when made on the p-type semiconductor with a certain doping concentration) or a p-type region (when made on the n-type semiconductor with a certain doping concentration). Therefore, for the FD CMOS of this embodiment, a process of fabricating the n-type region or the p-type region can be omitted, and multiple processing steps can be reduced, which is extremely beneficial and useful to shorten the process cycle, control the process error, reduce the chip process cost, and improve the performance and reliability of a device and a circuit. Further, since the gate electrodes of the nMOS and the pMOS in this embodiment are formed of the conductive materials with the same work function, preferably the same conductive material, as such it is not necessary to fabricate the gate electrodes of the nMOS and the pMOS separately, which can also reduce multiple processing steps, shorten the process cycle, control the process error, and reduce the chip process cost. In addition, the gate electrodes of the nMOS and the pMOS are formed of the same conductive material with the same work function, and the gate electrodes only need to be fabricated once, which is beneficial to improving the performance and reliability of the FD CMOS.

In summary, this embodiment simplifies two key process technologies of FD CMOS, reduces the processing steps for fabricating FD CMOS, and reduces the process and process difficulty, thus reducing the fabrication cost, and further improving the yield, performance and reliability of FD CMOS and its integrated circuits. In addition, the FD CMOS provided by this embodiment can also increase the threshold voltage control dimension and improve the switching speed.

It should be noted that the FD CMOS of this embodiment may also be provided with an electrode on the substrate layer, which controls the turn-on or turn-off of the device together with the upper gate electrode, thereby fully guaranteeing the depletion of the top semiconductor layer.

Eleventh Embodiment

Based on the tenth embodiment, this embodiment also provides a fabrication method of the FD CMOS, which includes following steps 10.1 to 10.4.

In step 10.1, a semiconductor substrate 10 is provided. The semiconductor substrate includes an insulating layer, and a top semiconductor layer located on the insulating layer. The top semiconductor layer is p-type doped or n-type doped.

In step 10.2, a gate dielectric layer 90, and a first gate electrode 30 and a second gate electrode 50 with the same work function are formed on the top semiconductor layer.

In step 10.3, a first source region 190 and a first drain region 200 are fabricated for the top semiconductor layer to form an nMOS.

In step 10.4, a second source region 210 and a second drain region 220 are fabricated for the top semiconductor layer to form a pMOS.

Further, in a specific embodiment, the step 10.2 may specifically include: growing a dielectric material layer on the top semiconductor layer, and growing a gate metal material on the surface of the dielectric material layer, to form the gate dielectric layer 90, and the first gate electrode 30 and the second gate electrode 50 located on the gate dielectric layer 90.

Specifically, it is necessary to deposit the dielectric material layer first on the top semiconductor layer used for forming the gate dielectric layer 90, then form the conductive material layer for forming the first gate electrode 30 and the second gate electrode 50 on the dielectric material layer, and then etch the conductive material and the dielectric material layer on the dielectric material layer to form the gate dielectric layer 90 and the first gate electrode 30 and the second gate electrode 50 on the gate dielectric layer 90.

Further, in a specific embodiment, the step 10.3 may specifically include: performing n-type doping on the top semiconductor layer of a region of the nMOS by ion implantation or diffusion, to form the first source region 190 and the first drain region 200.

Further, in a specific embodiment, the step 10.4 may specifically include: performing p-type doping on the top semiconductor layer of the pMOS region by ion implantation or diffusion to form the second source region 210 and the second drain region 220.

It should be noted that a sequence of steps of the fabrication method of this embodiment is not the only sequence to realize the FD CMOS provided in the second embodiment, but only for the convenience of explaining the fabrication method of this embodiment. For example, the second source region and the second drain region can be fabricated first, and then the first source region and the first drain region can be fabricated, which is not limited by the order of steps in this embodiment.

It should be understood that other specific process means for fabricating the FD CMOS in this embodiment can be realized by the prior art, and will not be repeated in detail herein.

The process technology involved in the present disclosure is compatible with the existing CMOS process technology, so the whole process is not given in this embodiment, and the order of some processes can be changed.

Twelfth Embodiment

Referring to FIGS. 16a to 16f, FIGS. 16a to 16f illustrate the schematic views of a fabrication process of the FD CMOS according to an embodiment of the present disclosure. On the basis of the eleventh embodiment, this embodiment also provides a specific fabrication method for the FD CMOS, which includes the following steps 11.1 to 11.7.

Figure 16A:
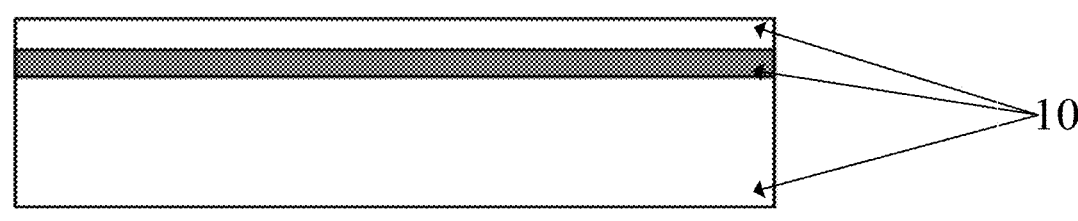
FIGS. 16a to 16f illustrate schematic views of a fabrication process of the FD CMOS according to an embodiment of the present disclosure.

In step 11.1, referring to FIG. 16a, a semiconductor substrate 10 is provided.

Specifically, the semiconductor substrate 10 is an SOI, and a top Si layer of the SOI may be an n-type semiconductor or a p-type semiconductor. When the top Si layer of the SOI is n-type Si or p-type Si, the process steps of CMOS has no difference, a process difference is only that the conductive material used in the subsequent fabrication of a gate electrode is different. A thickness and a doping concentration of the top Si layer are fabricated according to design requirements.

Figure 16B:
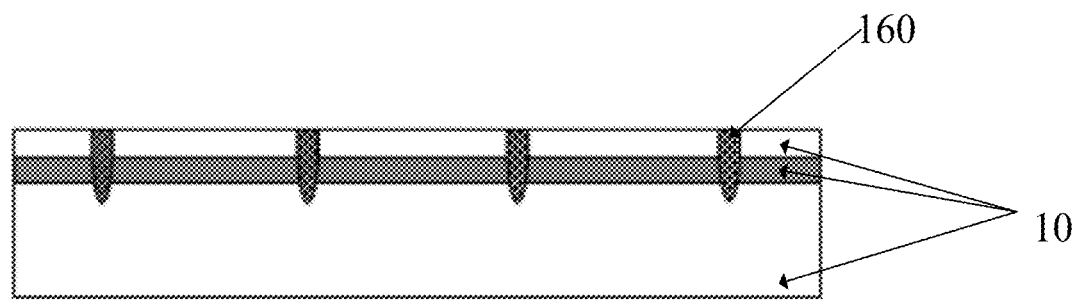

In step 11.2, referring to FIG. 16b, FIG. 16b is a front view, in which shallow trench isolations (STI) 160 are formed.

Specifically, according to the plane layout design of an nMOS and a pMOS, the semiconductor substrate is etched to form isolation trenches, and a dielectric is deposited in each of the isolation trenches to make the dielectric flush with a surface of the top Si layer, and thus to form the shallow trench isolations 160. The shallow trench isolations 160 are used to realize electrical isolation between the nMOS and the pMOS.

In step 11.3, a gate dielectric layer is deposited, and a gate electrode is fabricated.

Figure 16C:
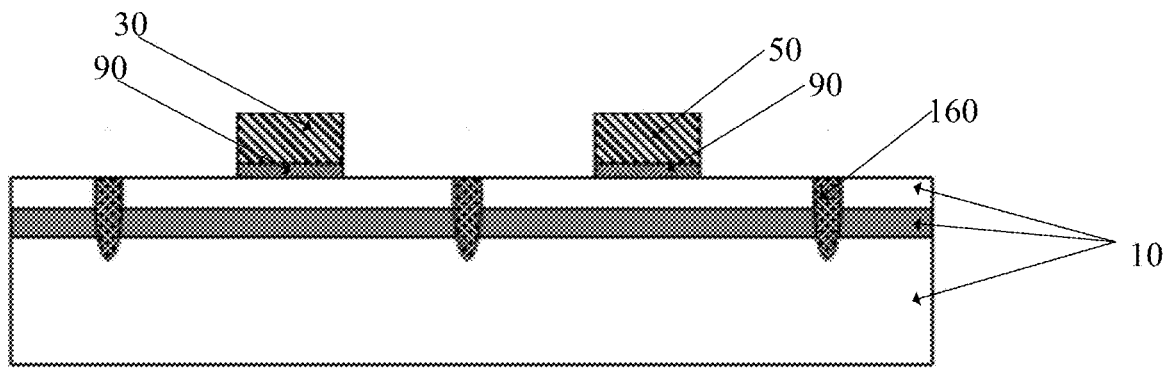

Specifically, referring to FIG. 16c, a dielectric material layer is first deposited on the top Si layer, and then the gate metal layer is deposited on the dielectric material layer, where the work function of the gate metal layer depends on the conductivity type of the top Si layer of SOI. A specific value of the work function of the gate metal layer is optimally determined based on an electrical parameter and a physical parameter of the top Si layer. Finally, the gate metal layer and the dielectric material layer are etched to form a gate dielectric layer 90 of the nMOS and a gate dielectric layer 90 of the pMOS, and a first gate electrode 30 and a second gate electrode 50 located on the gate dielectric layers 90.

In step 11.4, a lightly doped drain (LDD) is formed, for example, using a lightly doped drain implants process.

Figure 16D:
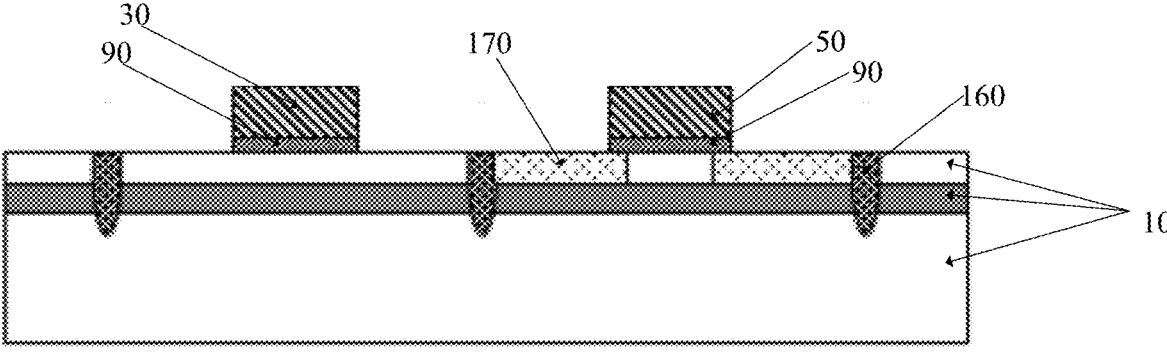

Specifically, because structures of devices in isolation regions are completely equivalent, it is necessary to first determine which devices are used as the nMOS and which devices are used as the pMOS, and then determine devices that need to perform the LDD implants process according to the conductivity type of the top Si layer. If the top Si layer is an n-type semiconductor, only a p-type LDD 170 is formed for the pMOS, for example, as shown in FIG. 16d; and if the top Si layer is a p-type semiconductor, only n-type LDD is formed for the nMOS.

In step 11.5, a sidewall dielectric is formed, and a source region and a drain region are formed.

Figure 16E:
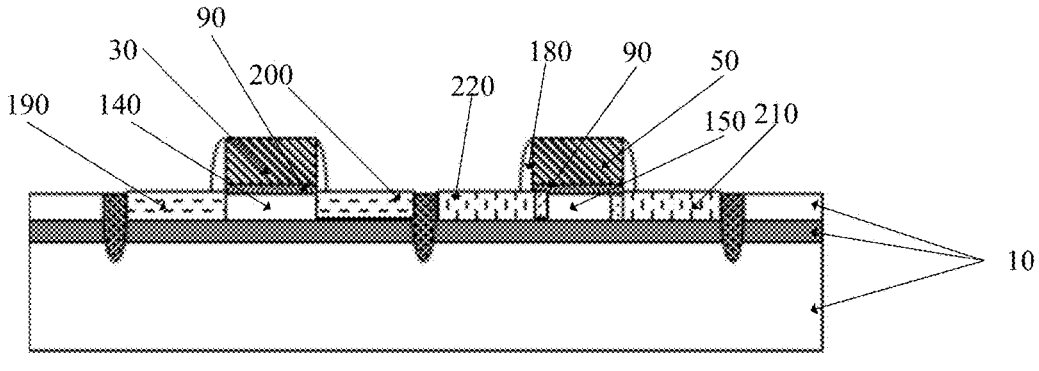

Specifically, referring to FIG. 16e, sidewall dielectrics 180 are first formed on sidewalls of the first gate electrode 30 and the second gate electrode 50, and then a top semiconductor layer in a region of the nMOS is n-doped using ion implantation or diffusion to fabricate a first source region 190 and a first drain region 200 which are n-doped, and a top semiconductor layer in a region of the pMOS is p-doped using ion implantation or diffusion to fabricate a second source region 210 and a second drain region 220 which are p-doped. A first channel region 140 is located between the first source region 190 and the first drain region 200, and a second channel region 150 is located between the second source region 210 and the second drain region 220.

In step 11.6, metal electrodes are formed.

Figure 16F:
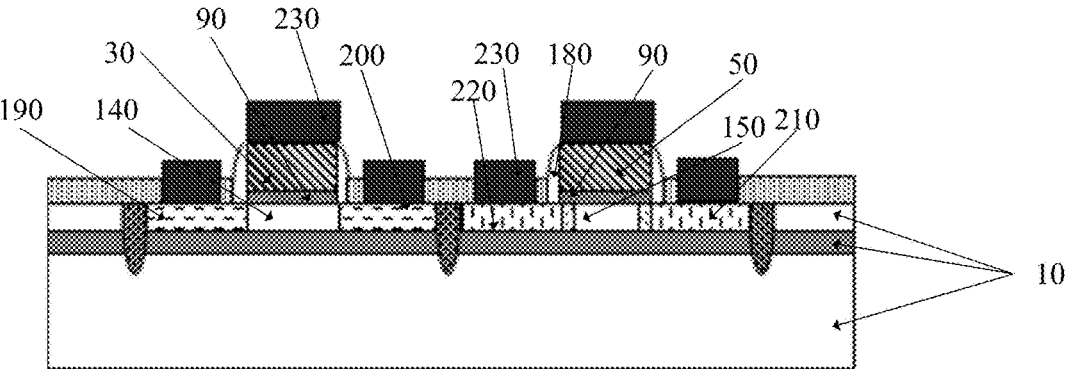

Specifically, referring to FIG. 16f, metal electrodes 230 in ohmic contact are formed in the source regions, the drain regions and the gate electrode regions of the nMOS and the pMOS by depositing and etching dielectric and metal.

In step 11.7, the FD-SOI CMOS is metallized.

Specifically, the FD SOI CMOS is obtained by metallization connection. The metallization process and method for forming the CMOS are the same as the conventional CMOS process, which are not be repeated herein.

Thirteenth Embodiment

Figure 17:
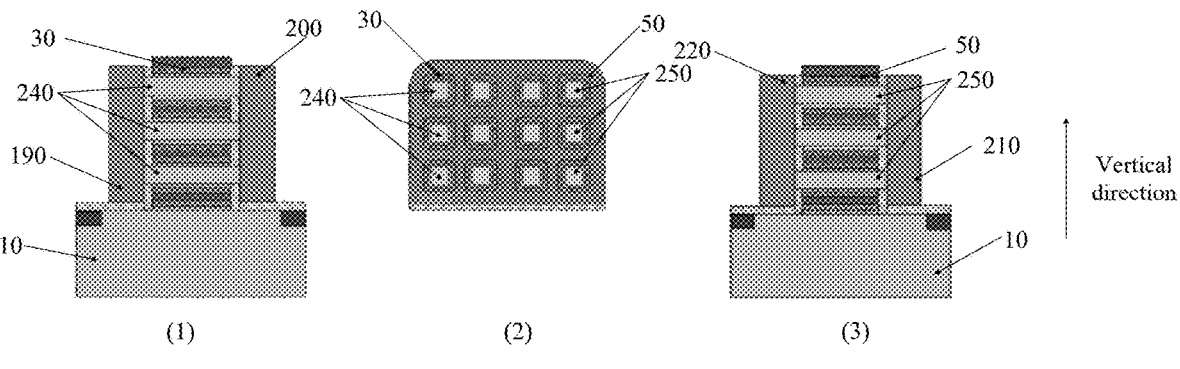
FIG. 17 illustrates a schematic structural view of a GAA CMOS according to an embodiment of the present disclosure.

Please refer to FIG. 17, FIG. 17 illustrates the schematic structural view of a GAA CMOS according to an embodiment of the present disclosure, where (1) and (3) represent the cross-sectional views of a side view, and (2) represents a partial cross-sectional view of a front view. On the basis of the first embodiment, this embodiment provides the GAA CMOS. An nMOS of the GAA CMOS includes first nano-body structures 240 formed on a semiconductor substrate 10 and first gate electrodes 30 surrounding the first nano-body structures 240. A pMOS of the GAA CMOS includes second nano-body structures 250 formed on the semiconductor substrate 10 and second gate electrodes 50 surrounding the second nano-body structures 250. The first nano-body structures 240 and the second nano-body structures 250 are formed of semiconductor materials with the same conductivity type. The first gate electrodes 30 and the second gate electrodes 50 are formed of the conductive materials with the same work function. It should be emphasized that thicknesses and doping concentrations of the first nano-structures 240 and the second nano-structures 250 should meet the requirement of complete depletion under work functions of the gate electrodes.

Specifically, when materials of the first nano-structures 240 and the second nano-structures 250 are n-type semiconductor materials with the same doping concentration, it is preferable that the work functions of the first gate electrodes 30 and the second gate electrodes 50 is in a range from 4.6 eV to 5.1 eV. When the materials of the first nano-structures 240 and the second nano-structures 250 are p-type semiconductor materials with the same doping concentration, it is preferable that the work functions of the first gate electrodes 30 and the second gate electrodes 50 is in a range from 4.1 eV to 4.5 eV. A specific value of the work function of each of the gate electrodes depends on parameters such as thickness and doping concentration of the corresponding nano-structure, which is not limited herein.

In this embodiment, the first nano-structures 240 includes at least one first nano-body, and the second nano-structures includes at least one second nano-body. When the number of the first nano-body and the second nano-body is greater than or equal to two, respectively, there are two arrangement modes for each of them, one is that the first nano-bodies and the second nano-bodies are formed in a stacked mode in a vertical direction which is shown in FIG. 17, and the other is that the first nano-bodies and the second nano-bodies are formed in the same layer in a horizontal direction.

Figure 18:
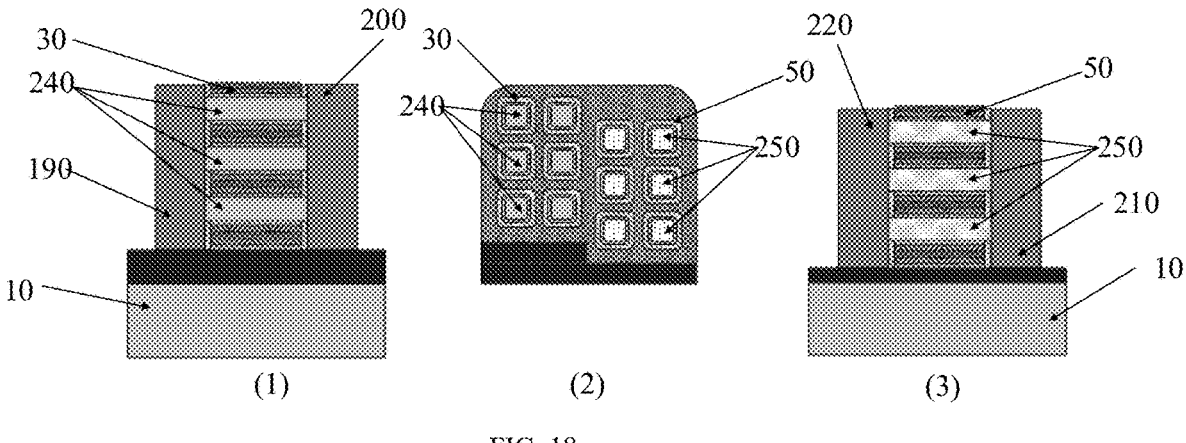
FIG. 18 illustrates a schematic structural view of another GAA CMOS according to an embodiment of the present disclosure.

In addition, the first nano-body and the second nano-body may be formed in the same layer or adjacent layers. When the first nano-body and the second nano-body are formed in the same layer, semiconductor materials used by the first nano-body and the second nano-body are the same, such as Si, Ge or SiGe. When the first nano-body and the second nano-body are formed in adjacent layers, the semiconductor materials used by the first nano-body and the second nano-body are different, for example, the material of the first nano-body is Si, and the material of the second nano-body is Ge or SiGe. For example, referring to FIG. 17 and FIG. 18, FIG. 17 illustrates the structure in which the first nano-body and the second nano-body are formed in the same layer, and FIG. 18 shows a structure in which the first nano-body and the second nano-body are formed in adjacent layers. In FIG. 18, (1) and (3) represent cross-sectional views of a side view, and (2) represents a partial cross-sectional view of a front view.

Further, the first nano-body and the second nano-body are nanosheets or nanowires. Nanosheets or nanowires may be semiconductor materials such as Si, SiGe, Ge, SiC and III-IV group.

In this embodiment, the semiconductor substrate 10 may be a bulk silicon substrate or an SOI substrate. The semiconductor substrate 10 can also be made of semiconductor materials such as Si, SiGe, Ge, SiC, and III-IV group.

In this embodiment, the first nano-structures of the nMOS and the second nano-structures of the pMOS are formed of semiconductor materials with the same conductivity type and having the same or similar doping concentration, preferably the same doping concentration, therefore, for the GAA CMOS of this embodiment, a process of fabricating semiconductor materials with different conductivity types can be omitted. As such, multiple processing steps can be reduced, which is extremely beneficial and useful to shorten the process cycle, control the process error, reduce the chip process cost, and improve the performance and reliability of a device and a circuit. Further, since the gate electrodes of the nMOS and the pMOS in this embodiment are formed of the conductive materials with the same work function, preferably the same conductive material, when the same conductive material is used as the gate electrodes, it is not necessary to separately fabricate the gate electrodes of the nMOS and the pMOS. Accordingly, it can also reduce multiple processing steps, shorten the process cycle, control the process error, and reduce a chip process cost. Since the gate electrodes of the nMOS and the pMOS are formed of the same conductive material with the same work function, the gate electrodes only need to be fabricated once, which is beneficial to improve the performance and reliability of the GAA CMOS.

In summary, in this embodiment, two key technologies of the GAA CMOS are simplified, the processing steps for fabricating the GAA CMOS are reduced, and the process and difficulty thereof are reduced, so that the fabrication cost can be reduced, and the yield, performance and reliability of the GAA CMOS and its integrated circuit can be improved. In addition, the GAA CMOS provided by this embodiment can also increase the regulation dimension of a threshold voltage and improve the switching speed.

Fourteenth Embodiment

Referring to FIGS. 17 and 18 again, based on the thirteenth embodiment, this embodiment also provides a fabrication method of the GAA CMOS, which includes the following steps 12.1 to 12.5.

In step 12.1, a semiconductor substrate 10 is provided.

In step 12.2, a first material stacked layer and a second material stacked layer are formed on the semiconductor substrate 10;

In step 12.3, a sacrificial layer of the first material stacked layer and a sacrificial layer of the second material stacked layer are respectively etched to form the first nano-body structures 240 with a first source region 190 and a first drain region 200 at both ends of the first nano-body structures 240, and second nano-body structures 250 with a second source region 210 and a second drain region 220 at both ends of the second nano-body structures 250.

In step 12.4, the gate dielectric layer, and the first gate electrodes 30 and the second gate electrodes 50 are formed around the first nano-body structures 240 and the second nano-body structures 250 to form an nMOS and a pMOS, where the first gate electrodes 30 and the second gate electrodes 50 have the same work function and the first nano-body structures and the second nano-body structures have the same conductivity type.

In step 12.5, metal is deposited to realize the metallization connection, as shown in FIGS. 17 and 18, to form the GAA CMOS.

Further, in a specific embodiment, step 12.2 may specifically include steps 12.21 and 12.22.

In step 12.21, a first material layer and a second material layer are alternately stacked on the semiconductor substrate 10.

In step 12.22, the stacked first and second material layers are etched to form the first material stacked layer and the second material stacked layer.

Specifically, the first material layer and the second material layer are sequentially formed and stacked on the semiconductor substrate 10, and then the stacked first material layer and the stacked second material layer are etched, thereby forming the first material stacked layer for fabricating the first nano-body structures 240 and a second material stacked layer for fabricating the second nano-body structures 250.

Further, the step 12.21 may specifically include:

when the first material layer and the second material layer are grown on the semiconductor substrate 10, using an in-situ doping method to form the first material layer and the second material layer with the same conductivity type and alternately stacked.

Further, in a specific embodiment, the step 12.3 may specifically include:

step 12.31, fabricating the first source region 190 and the first drain region 200 at the both ends of the first material stacked layer, and fabricating the second source region 210 and the second drain region 220 at the both ends of the second material stacked layer; and step 12.32, etching the sacrificial layer of the first material stacked layer to form the first nano-body structures 240 and etch the sacrificial layer of the second material stacked layer to form the second nano-body structures 250.

Specifically, the sacrificial layer is a material layer that needs to be removed. When the first material layer of the first material stacked layer and the first material layer of the second material stacked layer are etched away, the first and second nano-structures 240 and 250 with nano-sheets or nanowires in the same layer can be formed. When the first material layer of the first material stacked layer and the second material layer of the second material stacked layer are etched away, the first and second nano-structures 240 and 250 with nano-sheets or nanowires in adjacent layers can be formed.

Further, in a specific embodiment, the step 12.4 may specifically include:

step 12.41, growing a dielectric material around the first nano-body structures 240 and the second nano-body structures 250 to form a gate dielectric layer; and step 12.42, growing a gate electrode material on the surface of the gate dielectric layer to form the first gate electrodes 30 and the second gate electrodes 50 with the same work function.

It should be noted that a sequence of steps of the fabrication method of this embodiment is not the only sequence to realize the GAA CMOS provided in the first embodiment, but also for the convenience of explaining the fabrication method of this embodiment. For example, the first source region and the first drain region can be fabricated before the second source region and the second drain region, or the second source region and the second drain region can be fabricated before the first source region and the first drain region.

It should be understood that other specific process means for fabricating the GAA CMOS in this embodiment can be realized by the prior art, and will not be repeated in detail herein.

The process technology involved in the present disclosure is compatible with the existing CMOS process technology, so the whole process is not given in this embodiment, and the order of some processes can be changed.

In the description of the present disclosure, terms "first" and "second" are merely used for descriptive purposes, and cannot be understood as indicating or implying relative importance or implicitly indicating the number of indicated technical features. Therefore, the features defined as "first" and "second" may include one or more of these features explicitly or implicitly. In the description of the present disclosure, a term "multiple" means two or more, unless otherwise specifically defined.

In the description of this specification, descriptions referring to the terms "one embodiment", "some embodiments", "examples", "specific examples" or "some examples" mean that specific features, structures, materials, or special data points described in connection with this embodiment or example are included in at least one embodiment or example of the present disclosure. In this specification, the schematic expressions of the above terms are not necessarily aimed at the same embodiment or example. Moreover, the specific features, structures, materials, or special data points described may be combined in any one or more embodiments or examples in a suitable manner. In addition, those skilled in the art can combine and combine different embodiments or examples described in this specification.

The above is a further detailed description of the present disclosure in combination with specific preferred embodiments, and it cannot be considered that the specific implementation of the present disclosure is limited to these descriptions. For ordinary technicians in the technical field to which the present disclosure belongs, several simple deductions or substitutions can be made without departing from the concept of the present disclosure, all of which should be regarded as belonging to the scope of protection of the present disclosure.

What is claimed is:

1. A complementary metal oxide semiconductor (CMOS) structure, comprising an nMOS and a pMOS, wherein the nMOS comprises a first channel region and a first gate electrode formed on a semiconductor substrate, and the pMOS comprises a second channel region and a second gate electrode formed on the semiconductor substrate;

wherein the first channel region and the second channel region are formed of semiconductor materials with the same conductivity type;

wherein the first gate electrode and the second gate electrode are formed of conductive materials with the same work function;

wherein the CMOS structure is a fin field-effect transistor (FinFET) CMOS;

wherein the first channel region is formed in a first fin, the second channel region is formed in a second fin, and the first fin and the second fin are formed of the semiconductor materials with the same conductivity type and the same doping concentration;

wherein the first gate electrode is located on the first fin, and the second gate electrode is located on the second fin; and wherein the semiconductor substrate is bulk silicon including a Si substrate layer and a Si epitaxial layer located on the Si substrate layer, the Si substrate layer is one of a p-type material or an n-type material, the Si epitaxial layer is the other of the p-type material or the n-type material, and the first fin and the second fin are formed by the Si epitaxial layer of the bulk silicon.

2. The CMOS structure according to claim 1, wherein materials of the first fin and the second fin are formed of n-type semiconductor materials with the same doping concentration of the Si epitaxial layer of the bulk silicon, a transition structure whose cross section having the same shape and dimension as a cross section of the first fin is disposed at a lower part of the first fin, a material of the transition structure is the p-type material of the Si substrate layer, an n-type semiconductor layer with the same doping concentration as the second fin is formed below the second fin, and the n-type semiconductor layer is formed by the n-type material of the Si epitaxial layer.

3. The CMOS structure according to claim 1, wherein materials of the first fin and the second fin are formed of p-type semiconductor materials with the same doping concentration of the Si epitaxial layer of the bulk silicon, a p-type semiconductor layer with the same doping concentration as the first fin is formed below the first fin, the p-type semiconductor layer is formed by the p-type material of the Si epitaxial layer, a transition structure whose cross section having the same shape and dimension as a cross section of the second fin is reserved at a lower part of the second fin, and a material of the transition structure is the n-type material of the Si substrate layer.

4. The CMOS structure according to claim 1, wherein the semiconductor materials of the first channel region and the second channel region are n-type semiconductor materials with the same doping concentration; a first source region and a first drain region of the nMOS are n-type doped; and a second source region and a second drain region of the pMOS are p-type doped.

5. The CMOS structure according to claim 4, wherein the work function of the first gate electrode and the second gate electrode is in a range from 4.6 electron-volts (eV) to 5.1 eV.

6. The CMOS structure according to claim 1, wherein semiconductor materials of the first channel region and the second channel region are p-type semiconductor materials with the same doping concentration; a first source region and a first drain region of the nMOS are n-type doped; and a second source region and a second drain region of the pMOS are p-type doped.

7. The CMOS structure according to claim 6, wherein the work function of the first gate electrode and the second gate electrode is in a range from 4.1 eV to 4.5 eV.

8. A fabrication method of a CMOS structure comprising an nMOS and a pMOS, wherein the CMOS structure is a FinFET CMOS, and the fabrication method comprises:

providing a semiconductor substrate;

forming a first fin and a second fin with the same conductivity type on the semiconductor substrate, wherein the first fin comprises a first channel region, and the second fin comprises a second channel region;

forming, on top and sidewall surfaces of the first fin and the second fin, a gate dielectric layer, and a first gate electrode and a second gate electrode with the same work function;

fabricating a first source region and a first drain region in the first fin to form the nMOS;

fabricating a second source region and a second drain region in the second fin to form the pMOS;

wherein the first channel region and the second channel region are formed of semiconductor materials with the same conductivity type;

wherein the first gate electrode and the second gate electrode are formed of conductive materials with the same work function;

wherein the CMOS structure is a fin field-effect transistor (FinFET) CMOS;

wherein the first channel region is formed in a first fin, the second channel region is formed in a second fin, and the first fin and the second fin are formed of the semiconductor materials with the same conductivity type and the same doping concentration;

wherein the first gate electrode is located on the first fin, and the second gate electrode is located on the second fin; and wherein the semiconductor substrate is bulk silicon including a Si substrate layer and a Si epitaxial layer located on the Si substrate layer, the Si substrate layer is one of a p-type material or an n-type material, the Si epitaxial layer is the other of the p-type material or the n-type material, and the first fin and the second fin are formed by the Si epitaxial layer of the bulk silicon.

9. The fabrication method according to claim 8, wherein materials of the first fin and the second fin are formed of n-type semiconductor materials with the same doping concentration of the Si epitaxial layer of the bulk silicon, a transition structure whose cross section having the same shape and dimension as a cross section of the first fin is disposed at a lower part of the first fin, a material of the transition structure is the p-type material of the Si substrate layer, an n-type semiconductor layer with the same doping concentration as the second fin is formed below the second fin, and the n-type semiconductor layer is formed by the n-type material of the Si epitaxial layer.

10. The fabrication method according to claim 8, wherein materials of the first fin and the second fin are formed of p-type semiconductor materials with the same doping concentration of the Si epitaxial layer of the bulk silicon, a p-type semiconductor layer with the same doping concentration as the first fin is formed below the first fin, the p-type semiconductor layer is formed by the p-type material of the Si epitaxial layer, a transition structure whose cross section having the same shape and dimension as a cross section of the second fin is reserved at a lower part of the second fin, and a material of the transition structure is the n-type material of the Si substrate layer.

\* \* \* \* \*